United States Patent
Hoshi

(10) Patent No.: US 12,439,656 B2
(45) Date of Patent: Oct. 7, 2025

(54) SEMICONDUCTOR DEVICE AND MANUFACTURING METHOD OF THE SAME

(71) Applicants: DENSO CORPORATION, Kariya (JP); TOYOTA JIDOSHA KABUSHIKI KAISHA, Toyota (JP); MIRISE Technologies Corporation, Nisshin (JP)

(72) Inventor: Shinichi Hoshi, Nisshin (JP)

(73) Assignees: DENSO CORPORATION, Kariya (JP); TOYOTA JIDOSHA KABUSHIKI KAISHA, Toyota (JP); MIRISE Technologies Corporation, Nisshin (JP)

( * ) Notice: Subject to any disclaimer, the term of this patent is extended or adjusted under 35 U.S.C. 154(b) by 420 days.

(21) Appl. No.: 18/055,032

(22) Filed: Nov. 14, 2022

(65) Prior Publication Data

US 2023/0187490 A1    Jun. 15, 2023

(30) Foreign Application Priority Data

Dec. 10, 2021  (JP) .................................. 2021-200846
Jun. 14, 2022  (JP) .................................. 2022-096016

(51) Int. Cl.
  *H10D 62/10*  (2025.01)
  *H01L 21/02*  (2006.01)
  (Continued)

(52) U.S. Cl.
  CPC ........ *H10D 62/111* (2025.01); *H01L 21/0254* (2013.01); *H01L 21/30621* (2013.01);
  (Continued)

(58) Field of Classification Search
  None
  See application file for complete search history.

(56) References Cited

U.S. PATENT DOCUMENTS

2010/0117119 A1   5/2010  Uesugi et al.
2016/0093691 A1   3/2016  Echigoya et al.
(Continued)

FOREIGN PATENT DOCUMENTS

JP   2015099903 A   5/2015
JP      6679036 B1   4/2020

OTHER PUBLICATIONS

Nakajima et al., "High Density Two-Dimensional Hole Gas Induced by Negative Polarization at GaN/AlGaN Heterointerface." The Japan Society of Applied Physics, Dec. 10, 2010.
(Continued)

*Primary Examiner* — Jack S Chen
(74) *Attorney, Agent, or Firm* — Posz Law Group, PLC

(57) ABSTRACT

A semiconductor device includes a semiconductor substrate including a semiconductor element, a first surface-side electrode disposed on a first surface of the semiconductor substrate, and a second surface-side electrode disposed on a second surface of the semiconductor substrate. The semiconductor substrate includes a gallium nitride substrate and first column regions and second column regions disposed on a first principal surface of the gallium nitride substrate and alternately arranged along a c-axis direction in the first principal surface. The first column regions are formed of a first nitride semiconductor layer and the second column regions are formed of a second nitride semiconductor layer that is higher in band gap than the first nitride semiconductor layer. The semiconductor element is configured to enable a current to flow between the first surface and the second surface of the semiconductor substrate.

7 Claims, 18 Drawing Sheets

(51) Int. Cl.
  *H01L 21/306*   (2006.01)
  *H01L 21/308*   (2006.01)
  *H10D 30/01*    (2025.01)
  *H10D 30/47*    (2025.01)
  *H10D 62/824*   (2025.01)
  *H10D 62/85*    (2025.01)
  *H10D 64/27*    (2025.01)

(52) U.S. Cl.
  CPC ......... *H01L 21/308* (2013.01); *H10D 30/015* (2025.01); *H10D 30/477* (2025.01); *H10D 62/824* (2025.01); *H10D 62/8503* (2025.01); *H10D 64/513* (2025.01)

(56) References Cited

U.S. PATENT DOCUMENTS

| | | |
|---|---|---|
| 2017/0263710 A1 | 9/2017 | Matsumoto et al. |
| 2021/0384308 A1 | 12/2021 | Tanaka et al. |
| 2023/0187490 A1* | 6/2023 | Hoshi ................ H10D 30/668 257/76 |

OTHER PUBLICATIONS

Ishida et al., "GaN-based Natural Super Junction Diodes with Multichannel Structure." IEDM Technical Digests, Dec. 15, 2008.
Ishida et al., "Unlimited High Breakdown Voltage by Natural Super Junction of Polarized Semiconductor." IEEE Electron Device Letters, vol. 29, No. 10, Oct. 2008.

\* cited by examiner

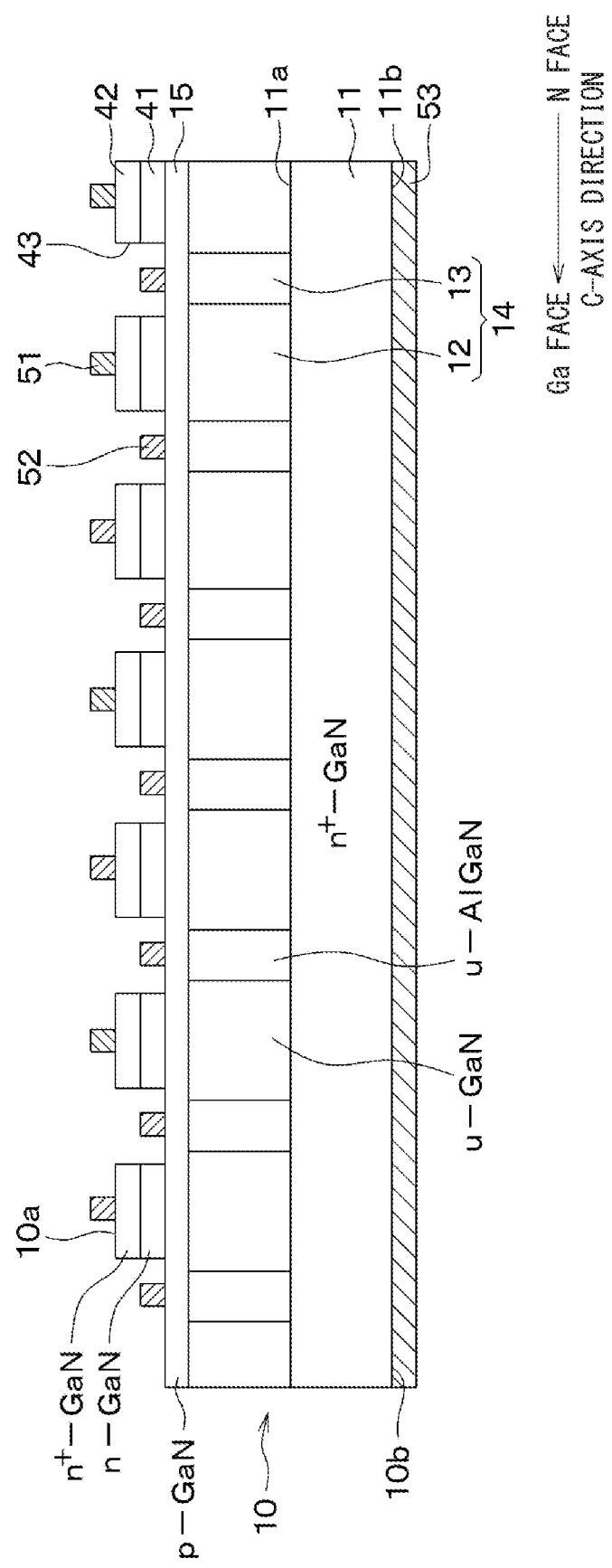

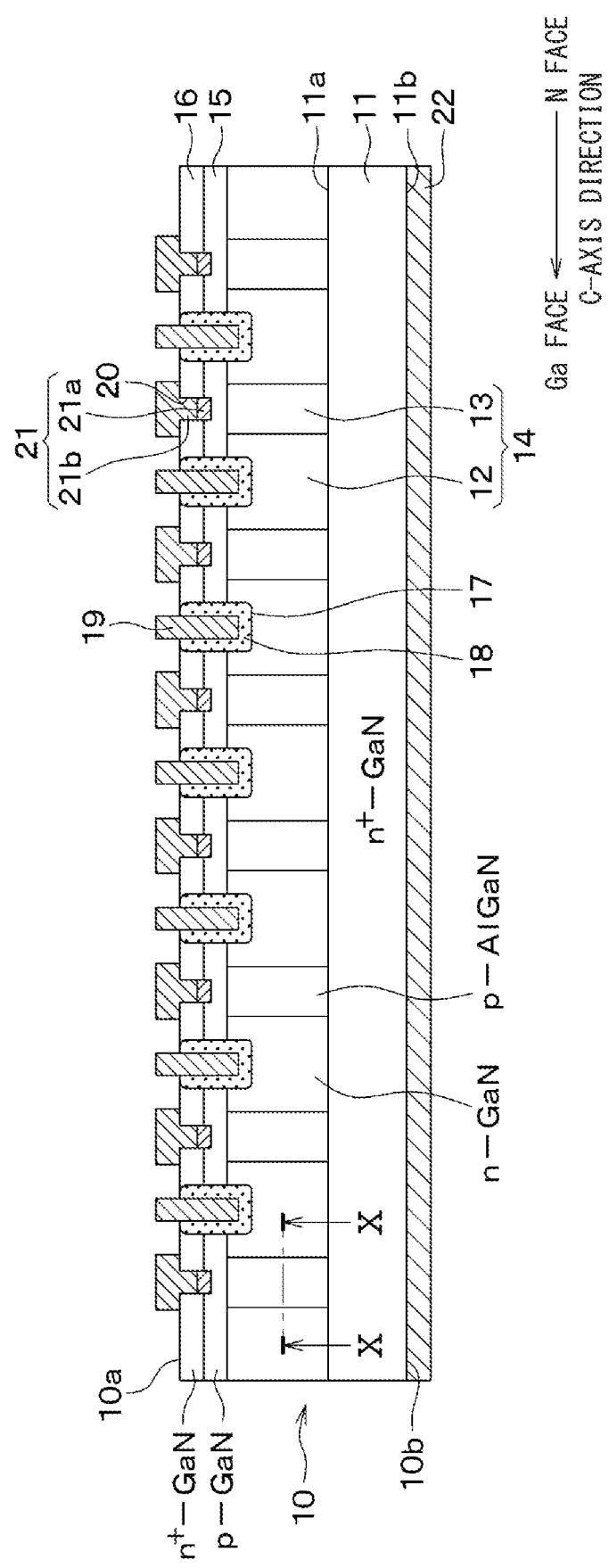

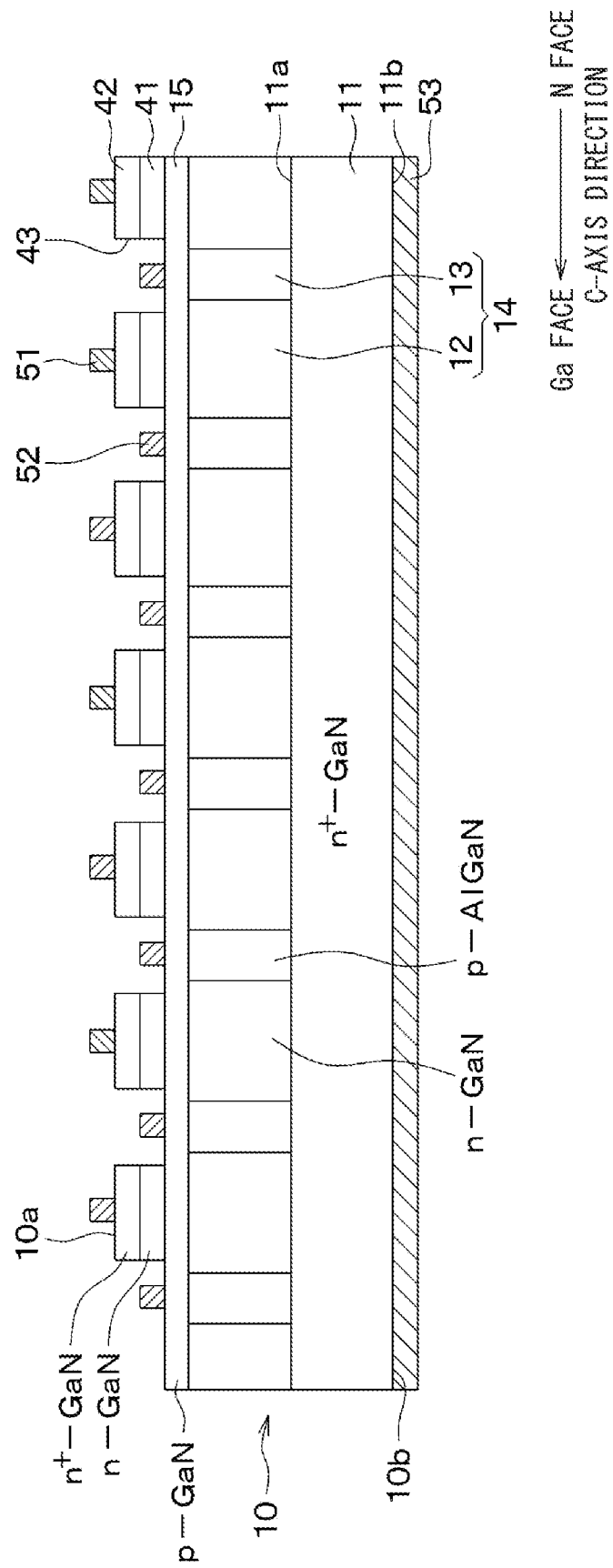

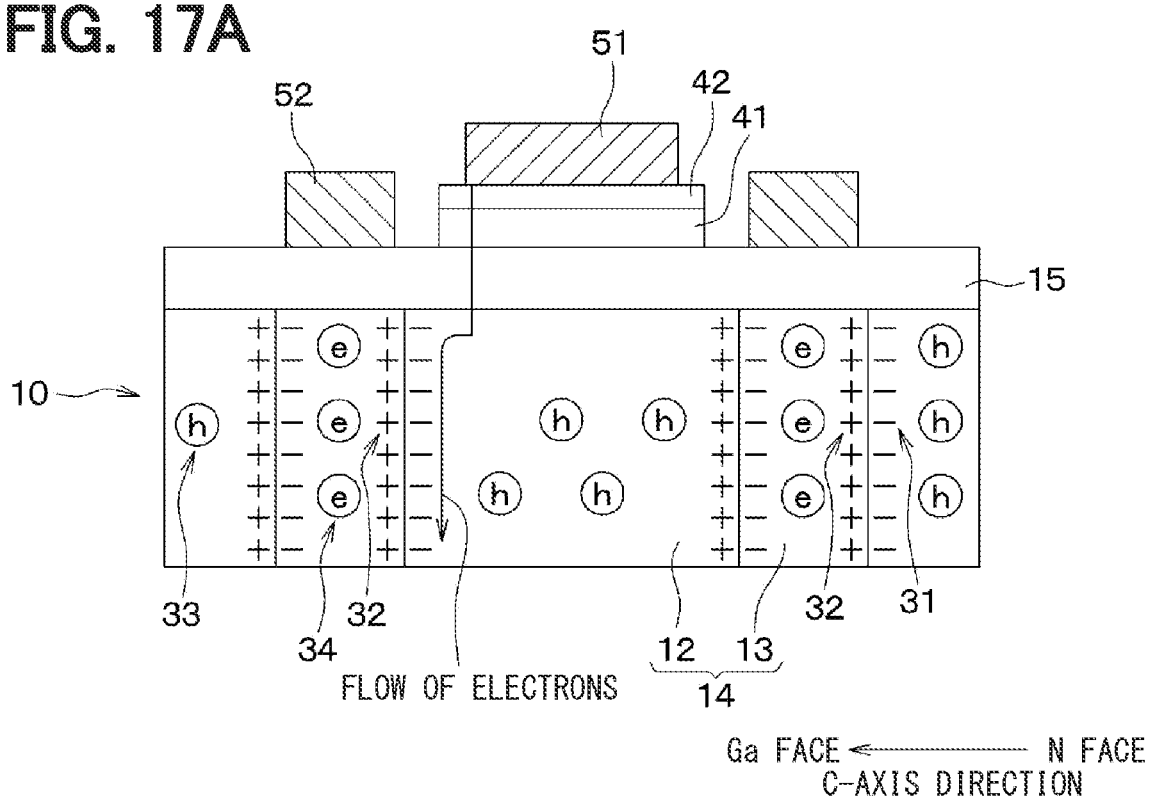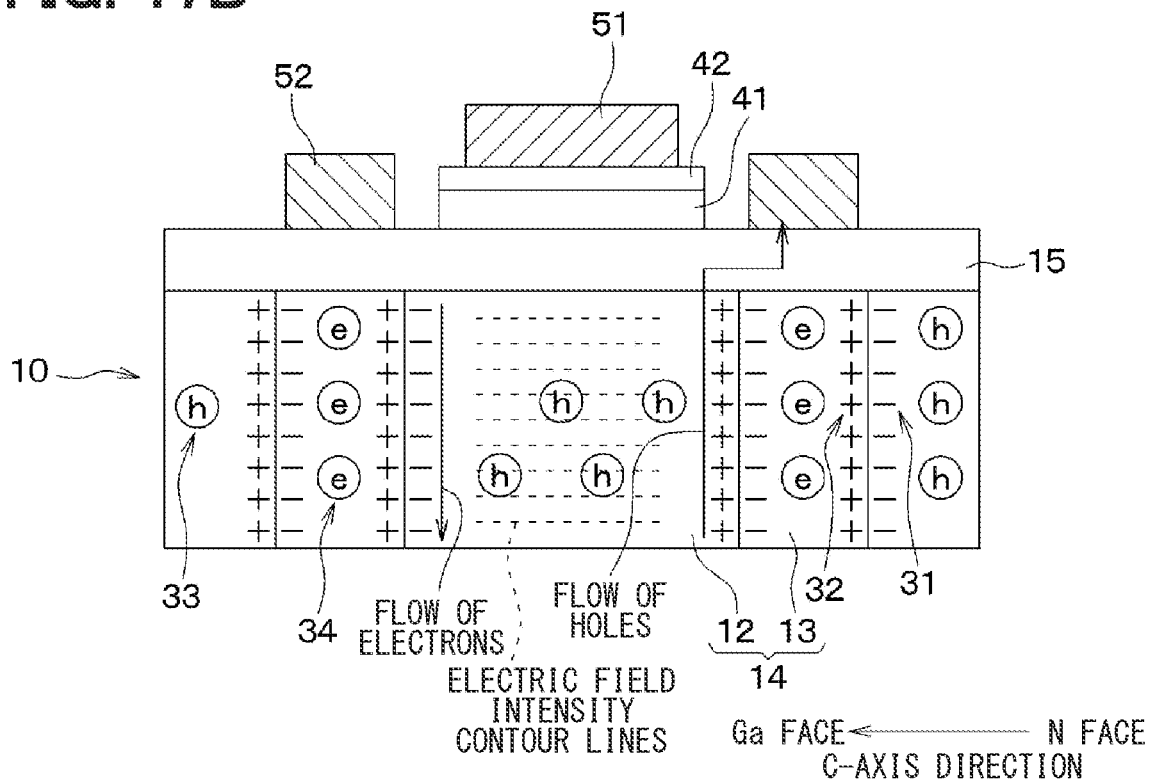

SEMICONDUCTOR DEVICE AND MANUFACTURING METHOD OF THE SAME

CROSS REFERENCE TO RELATED APPLICATIONS

The present application claims the benefit of priority from Japanese Patent Application No. 2021-200846 filed on Dec. 10, 2021 and Japanese Patent Application No. 2022-096016 filed on Jun. 14, 2022. The entire disclosures of all of the above applications are incorporated herein by reference.

TECHNICAL FIELD

The present disclosure relates to a semiconductor device having a polarization super junction (hereafter, also simply referred to as PSJ) structure and a manufacturing method of the semiconductor device.

BACKGROUND

There has been known a semiconductor device that has a PSJ structure including a first nitride semiconductor layer and a second nitride semiconductor layer laminated on a substrate.

SUMMARY

The present disclosure provides a semiconductor device that includes a semiconductor substrate including a semiconductor element, a first surface-side electrode disposed on a first surface of the semiconductor substrate, and a second surface-side electrode disposed on a second surface of the semiconductor substrate. The semiconductor substrate includes a gallium nitride substrate and first column regions and second column regions disposed on a first principal surface of the gallium nitride substrate and alternately arranged along a c-axis direction in the first principal surface. The first column regions are formed of a first nitride semiconductor layer and the second column regions are formed of a second nitride semiconductor layer that is higher in band gap than the first nitride semiconductor layer. The semiconductor element is configured to enable a current to flow between the first surface and the second surface of the semiconductor substrate. The present disclosure further provides a manufacturing method of the semiconductor device.

BRIEF DESCRIPTION OF DRAWINGS

Objects, features and advantages of the present disclosure will become apparent from the following detailed description made with reference to the accompanying drawings. In the drawings:

FIG. 7 is a sectional view of a semiconductor device in a second embodiment;

FIG. 9 is a sectional view of a semiconductor device in a third embodiment;

FIG. 16 is a sectional view of a semiconductor device in a fourth embodiment;

FIG. 17A is a schematic diagram of the semiconductor device in the fourth embodiment as is brought into an on state;

FIG. 17B is a schematic diagram of the semiconductor device in the fourth embodiment as is brought into an off state.

DETAILED DESCRIPTION

Figure 1:
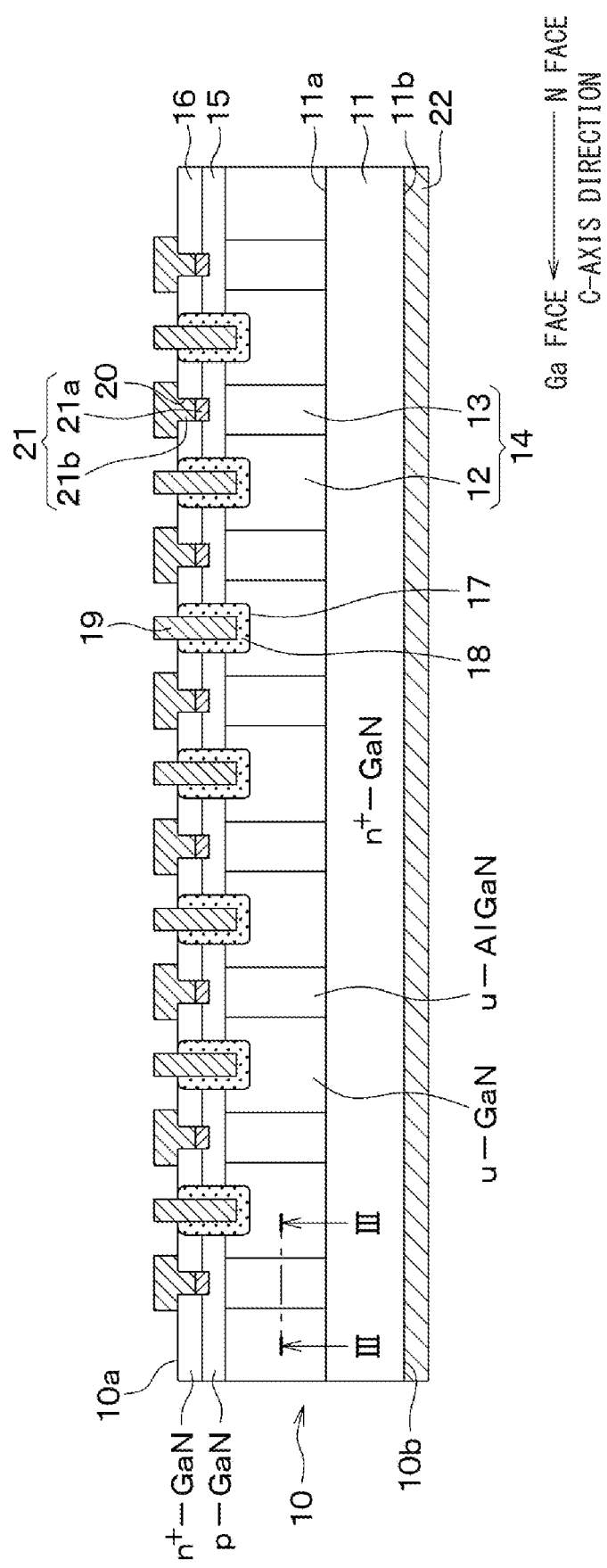
FIG. 1 is a sectional view of a semiconductor device in a first embodiment.

A semiconductor device according to a related art includes a semiconductor substrate having a PSJ structure in which a first nitride semiconductor layer, a second nitride semiconductor layer, and a first nitride semiconductor layer are laminated in a stated order on a substrate. The first nitride semiconductor layer is formed of, for example, a gallium nitride layer (hereafter, also simply referred to as GaN layer) and the second nitride semiconductor layer is formed of, for example, an aluminum gallium nitride layer (hereafter, also simply referred to as AlGaN layer). In the PSJ structure, at interfaces between the GaN layer and the AlGaN layer, two-dimensional electron gas (hereafter, also simply referred to as 2DEG) is produced on one side and two-dimensional hole gas (hereafter, also referred to as 2DHG) is produced on the other side.

This semiconductor device includes a semiconductor element such as a metal oxide semiconductor field effect transistor (MOSFET) formed using the above-described semiconductor substrate. A gate electrode, a source electrode, a drain electrode, and the like coupled with the semiconductor element are formed together on a first surface of the semiconductor substrate opposite to a second surface close to the substrate. Thus, when a predetermined voltage is applied to the gate electrode in the semiconductor device, a current flows along a planar direction of the semiconductor substrate.

In the above-described semiconductor device, since the gate electrode, the source electrode, and the drain electrode are disposed together on the first surface of the semiconductor substrate, limitations on a width, a thickness, and the like of each electrode may be large.

A semiconductor device according to an aspect of the present disclosure includes a semiconductor substrate, a first surface-side electrode, and a second surface-side electrode. The semiconductor substrate has a first surface and a second surface opposite to each other, and includes a semiconductor element. The first surface-side electrode is disposed on the first surface of the semiconductor substrate and is electrically coupled with the semiconductor element. The second surface-side electrode is disposed on the second surface of the semiconductor substrate and is electrically coupled with the semiconductor element. The semiconductor substrate includes a gallium nitride substrate, a plurality of first column regions, and a plurality of second column regions. The gallium nitride substrate has a hexagonal structure, and has a first principal surface and a second principal surface opposite to each other. The first principal surface is set to an m plane. One direction in a planar direction of the first principal surface is a direction along a c-axis direction. The second principal surface forms the second surface of the semiconductor substrate. The first column regions and the second column regions are disposed on the first principal surface of the gallium nitride substrate. The first column regions are formed of a first nitride semiconductor layer and extend along a direction in the planar direction of the gallium nitride substrate. The second column regions are formed of a second nitride semiconductor layer that is higher in band gap than the first nitride semiconductor layer. Each of the second column regions is disposed between adjacent two of the first column regions. The first column regions and the second column regions form a polarization superjunction structure. The first column regions and the second column regions are alternately arranged along the c-axis direction in the first principal surface. The semiconductor element is configured to enable a current to flow between the first surface and the second surface of the semiconductor substrate.

According to the above-described semiconductor device, the polarization super junction structure is arranged along the planar direction of the gallium nitride substrate to enable the current to flow in a thickness direction of the semiconductor substrate. For this reason, electrodes coupled with the semiconductor element can be classified into the first surface-side electrode and the second surface-side electrode and can be respectively disposed on the first surface and the second surface of the semiconductor substrate. As a result, limitations on each electrode coupled with the semiconductor element can be easily reduced.

A manufacturing method according to another aspect of the present disclosure is a manufacturing method of the above-described semiconductor device and includes: preparing the gallium nitride substrate; epitaxially growing a second column region forming layer that forms the second column regions on the first principal surface of the gallium nitride substrate; forming a plurality of embedding trenches at a plurality of portions in the second column region forming layer where the first column regions are to be formed, and taking a plurality of portions in the second column region forming layer different from the portions where the embedding trenches are formed as the second column regions; and epitaxially growing a first column region forming layer that forms the first column regions to fill the embedding trenches, taking the first column region forming layer disposed in the embedding trenches as the first column regions, and forming the polarization super junction structure having the first column regions and the second column regions.

According to the above-described manufacturing method, the semiconductor device that enables the current to flow in the thickness direction of the semiconductor substrate can be manufactured by arranging the polarization super junction structure along the planar direction of the gallium nitride substrate. Therefore, the limitations on each electrode coupled with the semiconductor element can be easily reduced.

A manufacturing method according to another aspect of the present disclosure is a manufacturing method of the above-described semiconductor device and includes: preparing the gallium nitride substrate; epitaxially growing a first column region forming layer that forms the first column regions on the first principal surface of the gallium nitride substrate; forming a plurality of embedding trenches at a plurality of portions in the first column region forming layer where the second column regions are to be formed, and taking a plurality of portions in the first column region forming layer different from the portions where the embedding trenches are formed as the first column regions; and epitaxially growing a second column region forming layer that forms the second column regions to fill the embedding trenches, taking the second column region forming layer disposed in the embedding trenches as the second column regions, and forming the polarization super junction structure having the first column regions and the second column regions.

According to the above-described manufacturing method, the semiconductor device that enables th current to flow in the thickness direction of the semiconductor substrate can be manufactured by arranging the polarization super junction structure along the planar direction of the gallium nitride substrate. Therefore, limitations on each electrode coupled with the semiconductor element can be easily reduced.

Hereafter, a description will be given to embodiments of the present disclosure with reference to the drawings. In the following description of each embodiment, identical or equivalent items will be marked with identical reference numerals.

First Embodiment

A description will be given to the first embodiment with reference to drawings. A semiconductor device according the present embodiment is suitably applicable as an apparatus for driving various vehicular electronic devices. In the description of the present embodiment, a semiconductor device including an inverting MOSFET of a trench gate structure as a semiconductor element will be taken as an example. Though to indicate an orientation of a crystal, a bar (-) should be essentially attached to above a desired numeral, in the following description in the present specification, a bar is affixed to a desired numeral because of expressional limitations based on electronic patent application.

Figure 2:
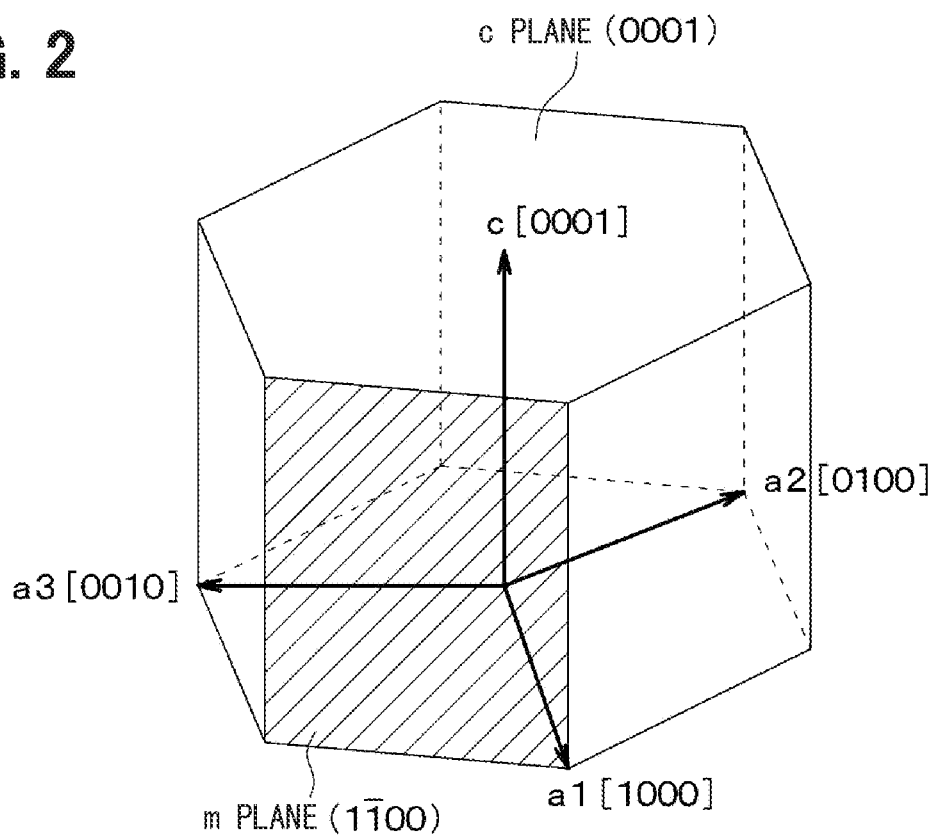
FIG. 2 is a schematic diagram illustrating a crystal orientation of a GaN substrate.

As shown in FIG. 1, the semiconductor device in the present embodiment includes a GaN substrate 11 having a first principal surface 11a and a second principal surface 11b opposite to each other. Specifically, the GaN substrate 11 is an n+-GaN substrate rendered n+ type by ion implantation or an epitaxial layer, and forms a drain region in the present embodiment. The GaN substrate 11 has a hexagonal structure. In this case, a crystal orientation of the GaN substrate 11 is as shown in FIG. 2. In the GaN substrate 11 in the present embodiment, the first principal surface 11a and the second principal surface 11b are set to {1-100} m planes and one direction in a planar direction of the first principal surface 11a and the second principal surface 11b is along the <0001>c-axis direction. In the present embodiment, the left and right direction of the sheet of FIG. 1 is a direction along the c-axis direction, and the left side of the sheet is set to a Ga face side and the right side is set to an N face side.

A polarization super junction (PSJ) structure 14 is disposed on the GaN substrate 11. The PSJ structure 14 includes a first column region 12 formed of a u-GaN layer as an updoped layer and a second column region 13 formed of a u-AlGaN layer as an updoped layer. In the present embodiment, the u-GaN layer corresponds to a first nitride semiconductor layer and the u-AlGaN layer corresponds to a second nitride semiconductor layer higher in band gap than the first nitride semiconductor layer. When the u-AlGaN layer forming the second column region 13 has a composition of $Al_{1-x}Ga_xN$, the u-AlGaN is formed to satisfy a relationship of $0 \leq x < 1$. The updoped layer in the present embodiment refers to a state in which even when an impurity is not doped or an n-type impurity and a p-type impurity are contained, a fixed charge is less than $5 \times 10^{16}/cm^3$. A state where even when an n-type impurity and a p-type impurity are contained, a fixed charge is less than $5 \times 10^{16}/cm^3$ is on assumption that an impurity is not willingly doped but an n-type impurity or a p-type impurity is unintentionally contained during manufacture. The fixed charge cited here means positively charged ionized impurity concentration obtained after emission of electrons for n type and negatively charged ionized impurity concentration after emission of holes for p type.

Each of the first column region 12 and the second column region 13 is formed of an epitaxial layer. The first column region 12 and the second column region 13 are extended with one direction in the planar direction of the GaN substrate 11 taken as the longitudinal direction and the first column regions 12 and the second column regions 13 are alternately disposed in a direction orthogonal to the longitudinal direction. That is, the first column regions 12 and the second column regions 13 are disposed in a stripe. The first column regions 12 and the second column regions 13 are alternately disposed along the c-axis direction.

Figure 3:
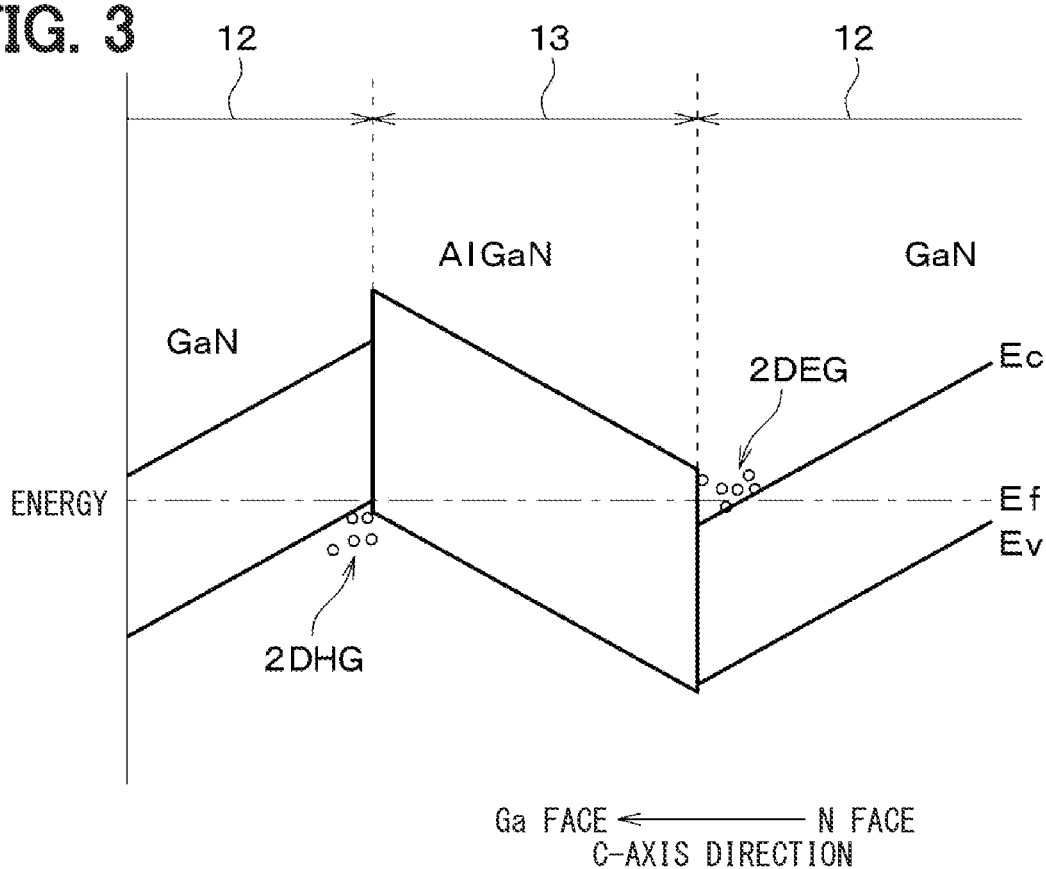
FIG. 3 is an energy band diagram of a PSJ structure.

In the PSJ structure 14 disposed on the GaN substrate 11 as described above, 2DEG (that is, negative electric charge of polarized charge) and 2DHG (that is, positive electric charge of polarized charge) are induced at an AlGaN/GaN interface as the interface between the first column region 12 and the second column region 13 due to polarization effect and the like. Specifically, as shown in FIG. 3, in the first column regions 12, 2DEG is produced on the Ga face side and 2DHG is produced on the N face side. As a result, in the second column region 13, 2DEG is produced on the Ga face side and 2DHG is produced on the N face side. FIG. 3 is an energy band diagram of a part taken along line III-III of FIG. 1.

As shown in FIG. 1, a base layer 15 formed of a p-GaN layer doped with a p-type impurity is disposed on the PSJ structure 14. The base layer 15 is formed of an epitaxial layer. A dose of magnesium (Mg) as a p-type impurity is $1 \times 10^{19}/cm^2$ and a thickness of the base layer 15 is approximately 500 nm though not specially limited to this example.

A source region 16 formed of an n-GaN layer doped with a n+-type impurity is disposed on a surface layer portion of the base layer 15. The source region 16 is formed of a an epitaxial layer or an ion implantation layer. In the present embodiment, the source region 16 corresponds to an impurity region.

In the present embodiment, as described above, the semiconductor substrate 10 includes the GaN substrate 11, the PSJ structure 14, the base layer 15, the source region 16, and the like. The semiconductor substrate 10 has a first surface 10a formed of the source region 16 and a second surface 10b formed of the second principal surface 11b of the GaN substrate 11.

In the semiconductor substrate 10, a plurality of gate trenches 17 are formed to penetrate the source region 16 and the base layer 15 and extend from the first surface 10a to the first column regions 12. The gate trenches 17 are extended in one direction of the planar direction of the first surface 10a of the semiconductor substrate 10 (that is, the depth direction of the sheet in FIG. 1) as a longitudinal direction and the gate trenches 17 are arranged in a strip at equal intervals. Specifically, the gate trenches 17 are extended along the longitudinal direction of the first column regions 12.

Each of the gate trenches 17 is filled with a gate insulating film 18 disposed to cover a wall surface of the gate trench 17 and a gate electrode 19 formed of polysilicon and the like on the gate insulating film 18. As a result, a trench gate structure is configured.

In the semiconductor substrate 10, a contact trench 20 is formed between adjacent trench gate structures so that the contact trench 20 penetrates the source region 16 and is extended from the first surface 10a to the base layer 15. The contact trenches 20 in the present embodiment are formed to reach the base layer 15 located on the second column regions 13.

A source electrode 21 is disposed in each contact trench 20. The source electrodes 21 in the present embodiment are formed of a plurality metals such as Ni/Al. Specifically, in the source electrode 21, a portion in contact with a portion forming a n-type region (that is, the source region 16) is formed of a metal that can be brought into ohmic contact with the n-type region. In the source electrode 21, further, a portion in contact with a p-type region (that is, the base layer 15) is formed of a metal that can be brought into ohmic contact with the p-type region. In the present embodiment, in each source electrode 21, the first portion 21a in contact with the base layer 15 is formed to contain Ni and the second portion 21b in contact with the source region 16 is formed to contain Al/Ti. In the present embodiment, the gate electrodes 19 and the source electrodes 21 correspond to a first surface-side electrode. In the present embodiment, the source electrodes 21 corresponds to a base layer electrode.

A drain electrode 22 electrically coupled with the GaN substrate 11 is formed on the second surface 10b of the semiconductor substrate 10. In the present embodiment, the drain electrode 22 corresponds to a second surface-side electrode.

In the semiconductor device of the present embodiment, MOSFET of a trench gate structure as an inverting type of a n-channel type is formed based on the above-described structure. In the present embodiment, the $n^+$-type and the $n^-$-type correspond to a first conductivity type and the p-type corresponds to a second conductivity type.

Figure 4A:
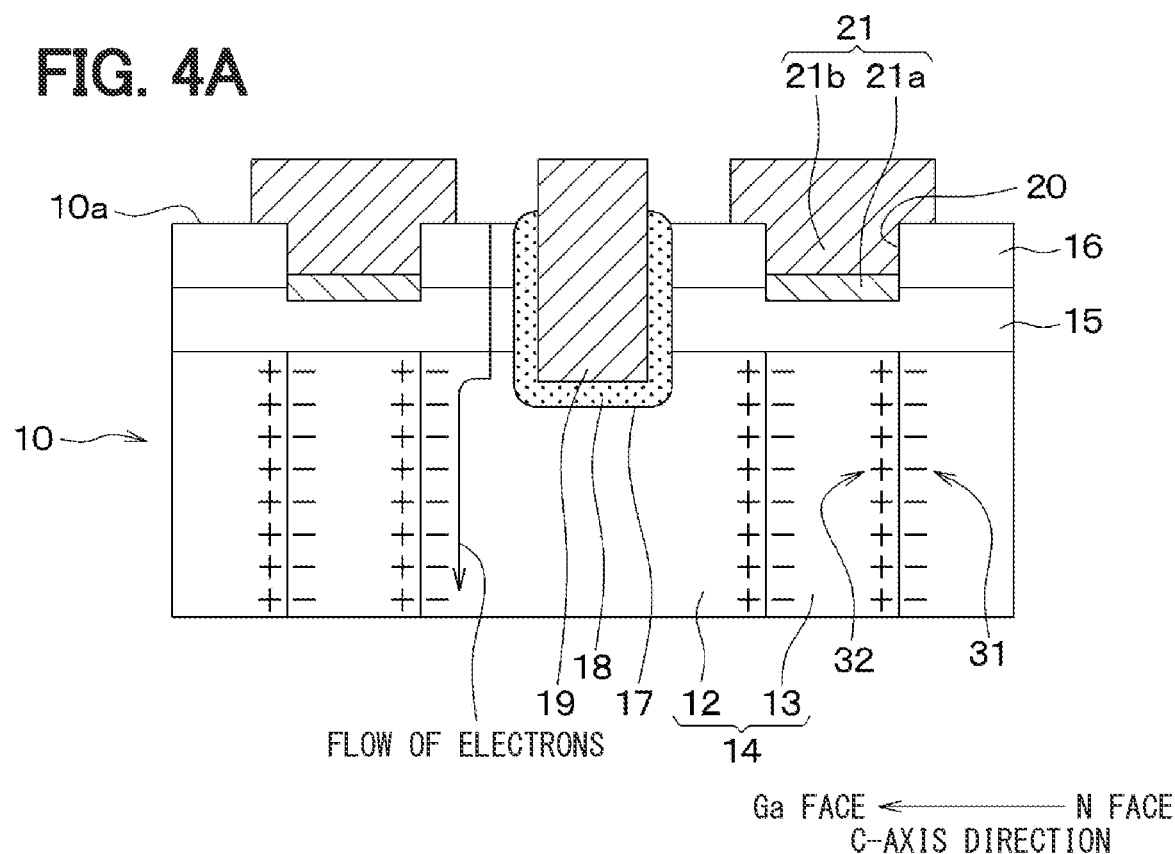
FIG. 4A is a schematic diagram of a semiconductor device in the first embodiment as is brought into an on state.
Figure 4B:
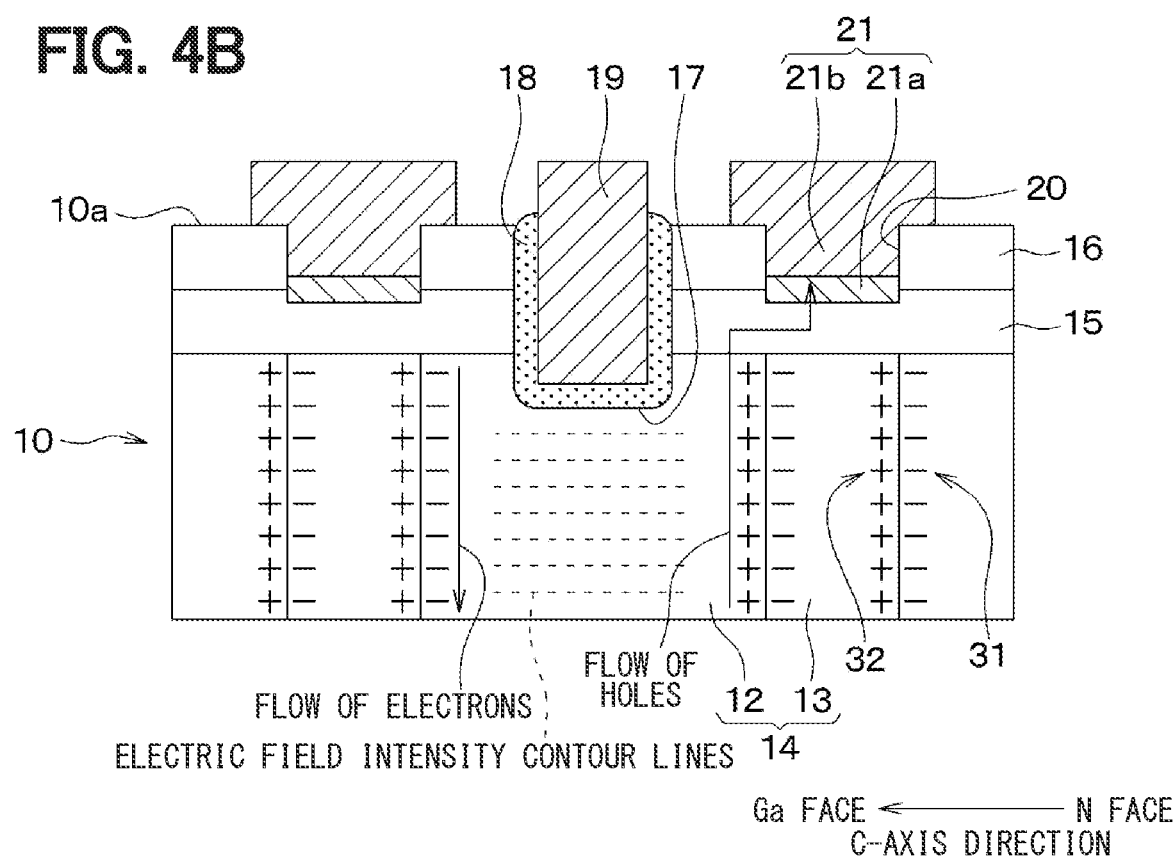
FIG. 4B is a schematic diagram of a semiconductor device in the first embodiment as is brought into an off state.

A description will be given to an operation and effects of a semiconductor device in the present embodiment with reference to FIG. 4A and FIG. 4B. In FIG. 4A and FIG. 4B, the GaN substrate 11 and the drain electrode 22 are omitted.

In the PSJ structure 14, as shown in FIG. 4A, the 2DEG 31 and the 2DHG 32 are produced at the interfaces between the first column regions 12 and the second column regions 13. When a voltage equal to or higher than a threshold voltage, for example, 6V is applied to the gate electrode 19, an inversion layer is formed on a surface of the base layer 15 in contact with the gate trench 17. As a result, electrons are supplied from the source electrode 21 and an on state is established and a current flows to the drain electrode 22 through the 2DEG 31 formed in the first column region 12. That is, in the semiconductor device, a current flows along the thickness direction of the semiconductor substrate 10. Since a portion that is prone to be extracted does not exist in the 2DHG 32 at this time, an electron current becomes dominant in the current flowing through the semiconductor device.

When a gate voltage applied to the gate electrode 19 becomes less than the threshold voltage, for example, 0V as shown in FIG. 4B, an inversion layer is not formed in the base layer 15 and electrons are not newly supplied from the source electrode 21 anymore. For this reason, even when a positive voltage, for example, 300V is applied to the drain electrode 22, the semiconductor device is brought into an off state and a current does not flow. At this time, electrons that have been supplied from the first column region 12 are discharged from the drain electrode 22. Holes produced or present in the first column region 12 are discharged from the source electrode 21. As a result, the PSJ structure 14 is depleted and is brought into a charge balance state balanced at a polarized charge. The dotted lines in FIG. 4B show a schematic diagram of electric field intensity contour lines.

Therefore, in the semiconductor device described above, ideally, breakdown voltage characteristics up to 3 MV/cm, which is a breakdown electric field intensity of GaN, are obtained. That is, a breakdown voltage of 300 V is obtained by setting a thickness of the PSJ structure 14 to, for example, 1 µm.

In case of a semiconductor device having a super junction structure using, for example, silicon, it has been reported that a maximum breakdown intensity is 0.3 MV/cm. Thus, as compared with such a semiconductor device, in the semiconductor device in the present embodiment, the same maximum breakdown intensity can be obtained with a column thickness (that is, column depth) of $\frac{1}{10}$. In other words, in the semiconductor device in the present embodiment, as compared with a semiconductor device having a super junction structure using silicon, a column thickness of the PSJ structure 14 can be reduced and a manufacturing process can be easily simplified. The column thickness refers to a length along a direction in which the GaN substrate 11 and the PSJ structure 14 are laminated.

In the PSJ structure 14 in the present embodiment, as shown in 4B, electric field intensity is less prone to concentrate. For this reason, application of great electric field intensity to the gate insulating film 18 can be suppressed and the reliability of the gate insulating film 18 can be enhanced.

A description will be given to a manufacturing method of the above-described semiconductor device with reference to FIG. 5A to FIG. 5D.

Figure 5A:
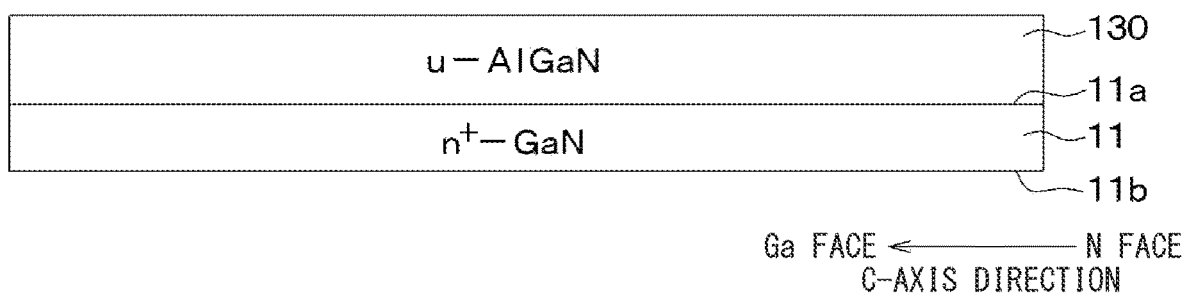
FIG. 5A is a sectional view illustrating a manufacturing process for the semiconductor device in the first embodiment.

First, as shown in FIG. 5A, the GaN substrate 11 in which the first principal surface 11a and the second principal surface 11b are set to the m plane and which is rendered $n^+$ type is prepared. A second column region forming layer 130 forming the second column regions 13 is disposed on the first principal surface 11a of the GaN substrate 11 by epitaxial growth. The second column region forming layer 130 is formed of a u-AlGaN layer as an updoped layer.

Figure 5B:
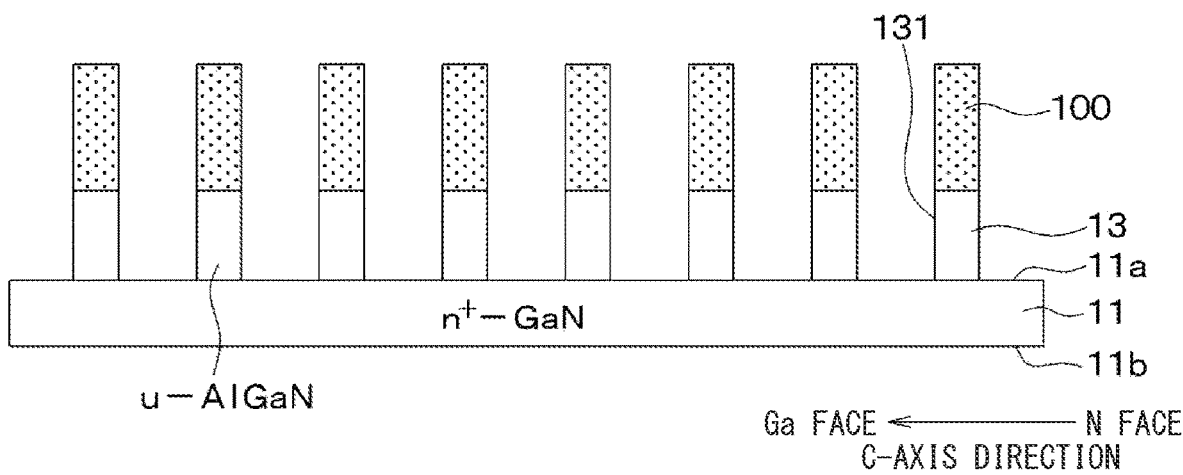
FIG. 5B is a sectional view illustrating the manufacturing process for the semiconductor device in the first embodiment, following FIG. 5A.

Subsequently, as shown in FIG. 5B, a resist 100 is disposed on the second column region forming layer 130 and the resist 100 is patterned so as to expose portions where the first column regions 12 are to be formed. Then, using the resist 100 as a mask, a dry etching such as an inductively coupled plasma-reactive ion etching (ICP-RIE) is performed to form embedding trenches 131 for placing the first column regions 12. As a result, the second column region 13 is formed at portions of the second column region forming layer 130 sandwiched between embedding trenches 131. That is, the second column regions 13 are formed at portions of the second column region forming layer 130 where the embedding trenches 131 are not formed.

Figure 5C:
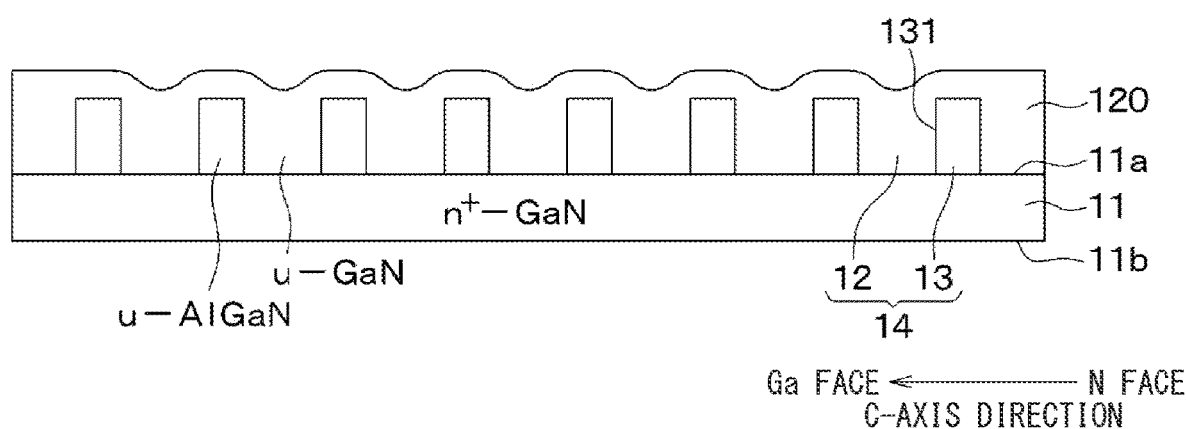
FIG. 5C is a sectional view illustrating the manufacturing process for the semiconductor device in the first embodiment, following FIG. 5B.

Subsequently, as shown in FIG. 5C, a first column region forming layer 120 forming the first column regions 12 is disposed by epitaxial growth to fill the embedding trenches 131. As a result, the first column regions 12 are formed in the embedding trenches 131 and the PSJ structure 14 including the first column regions 12 and the second column regions 13 is formed. The first column region forming layer 120 is formed of a u-GaN layer as an updoped layer.

Figure 5D:
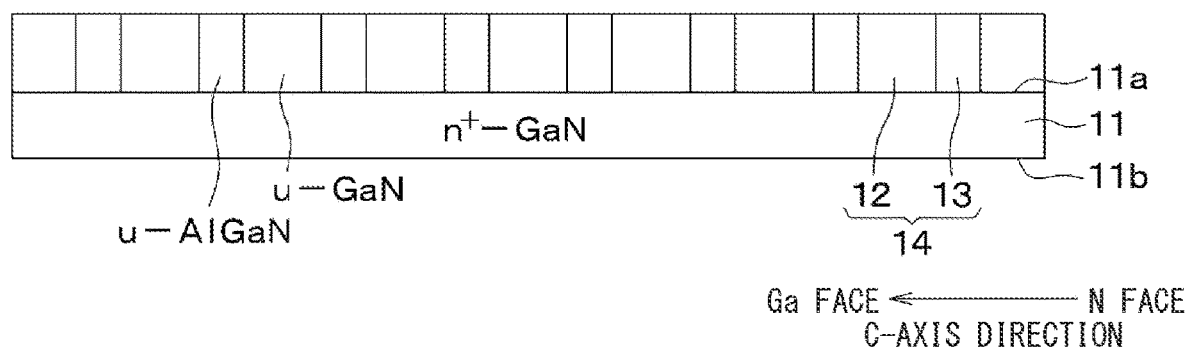
FIG. 5D is a sectional view illustrating the manufacturing process for the semiconductor device in the first embodiment, following FIG. 5C.

Subsequently, as shown in FIG. 5D, the first column region forming layer 120 formed over the second column region forming layer 130 is removed by polishing, such as chemical mechanical polishing (CMP).

Thereafter, though a detailed description of process is omitted, a predetermined semiconductor manufacturing process is performed to form the base layer 15, the source region 16, the trench gate structure, the source electrode 21, the drain electrode 22, and the like and the above-described semiconductor device is thereby manufactured.

According to the present embodiment described above, the PSJ structure 14 is arranged along the planar direction of the GaN substrate 11 so that the current flows in the thickness direction of the semiconductor substrate 10. Thus, the electrodes 19, 21, 22 coupled with the semiconductor element can be dividedly disposed on the first surface 10a and the second surface 10b of the semiconductor substrate 10, and limitations on each electrode 19, 21, 22 can be reduced.

In the present embodiment, the base layer 15 formed of a p-GaN layer is disposed on the PSJ structure 14. Thus, when the semiconductor device is manufactured, after the process shown in FIG. 5C is performed, the p-GaN layer may be formed to form the base layer 15 on the u-GaN layer without performing the process shown in FIG. 5D.

In the present embodiment, MOSFET is formed as the semiconductor element and the base layer 15 disposed on the PSJ structure 14 is coupled with the source electrode 21. Therefore, holes that can be present in the first column regions 12 in an off state can be extracted from the source electrode 21 and a state in which the PSJ structure 14 is balanced at a polarized charge can be established.

In the present embodiment, the first column regions 12 and the second column regions 13 are arranged along the planar direction of the GaN substrate 11 and a current is let to flow along the thickness direction of the semiconductor substrate 10. Therefore, a large current can be easily let to flow as compared with cases where a GaN layer and an AlGaN layer are laminated to form a PSJ structure and a MOSFET is formed using this PSJ structure. A more detailed description will be given. As a semiconductor device including a PSJ structure obtained by laminating a GaN layer and an AlGaN layer, a semiconductor device with MOSFET formed by placing a gate electrode over a PSJ structure is possible. However, in this semiconductor device, the semiconductor device cannot be possibly switched between an on state and an off state by a gate voltage applied to the gate electrode when the GaN layers and the AlGaN layers are excessively laminated. In the present embodiment, meanwhile, the first column regions 12 and the second column regions 13 are arranged along the planar direction of the GaN substrate 11 and a current is let to flow along the thickness direction of the semiconductor substrate 10. Therefore, numbers of the first column regions 12 and the second column regions 13 may be changed as appropriate and a large current can be easily coupled with.

In the present embodiment, the first column regions 12 and the second column regions 13 are formed of an updoped layer. Thus, as compared with cases where the first column regions 12 and the second column regions 13 are formed of a doped layer as in a third embodiment described later, extraction of holes can be facilitated when an off state is established because an impurity is low in quantity and switching speed can be facilitated.

(Modification to First Embodiment)

Figure 6A:
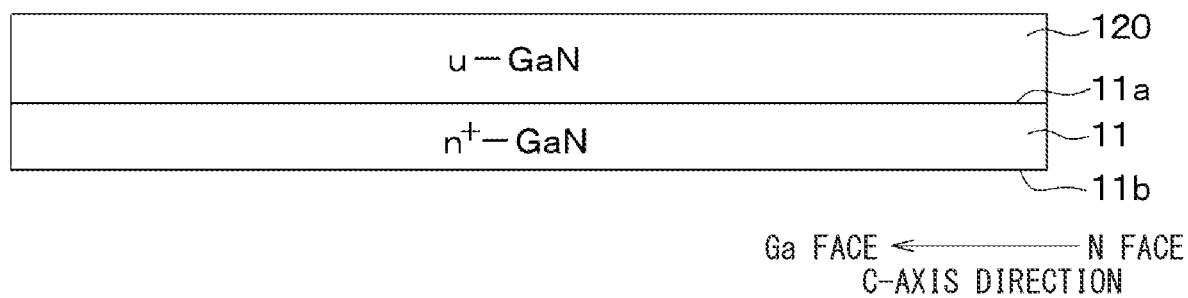
FIG. 6A is a sectional view illustrating a manufacturing process for a semiconductor device in a modification to the first embodiment.
Figure 6B:
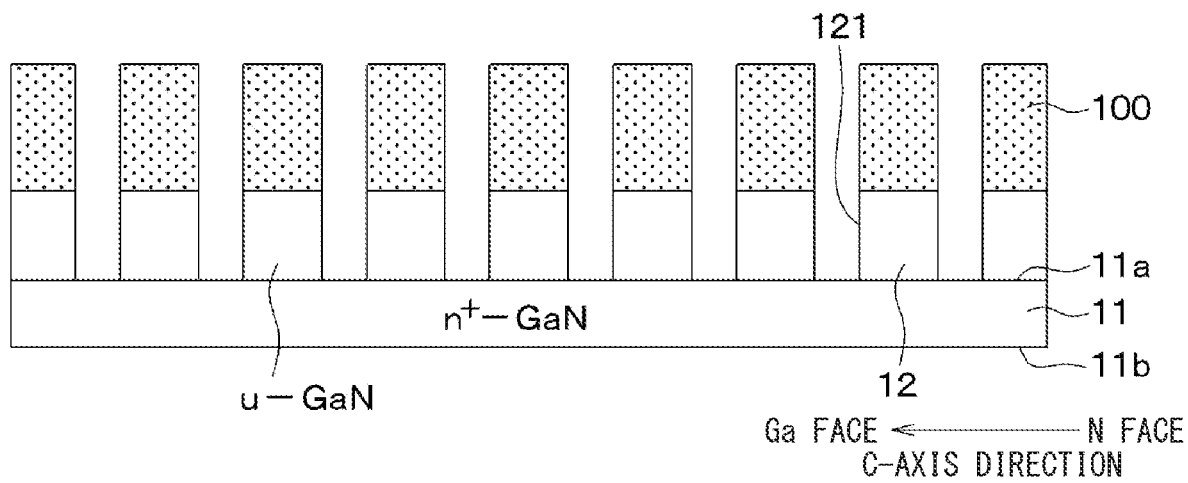
FIG. 6B is a sectional view illustrating the manufacturing process for the semiconductor device, following FIG. 6A.

A description will be given to a modification to the first embodiment. In the first embodiment, the PSJ structure 14 may be formed on the GaN substrate 11 as described below. After the GaN substrate 11 is prepared, as shown in FIG. 6A, the first column region forming layer 120 forming the first column regions 12 is disposed on the first principal surface 11a of the GaN substrate 11 by epitaxial growth. Subsequently, as shown in FIG. 6B, a resist 100 is disposed on the first column region forming layer 120 and dry etching is performed to form the embedding trenches 121 for placing the second column regions 13. As a result, the first column regions 12 are formed at portions of the first column region forming layer 120 sandwiched between embedding trenches 121. That is, the first column regions 12 are formed at portions of the first column region forming layer 120 where the embedding trenches 121 are not formed.

Figure 6C:
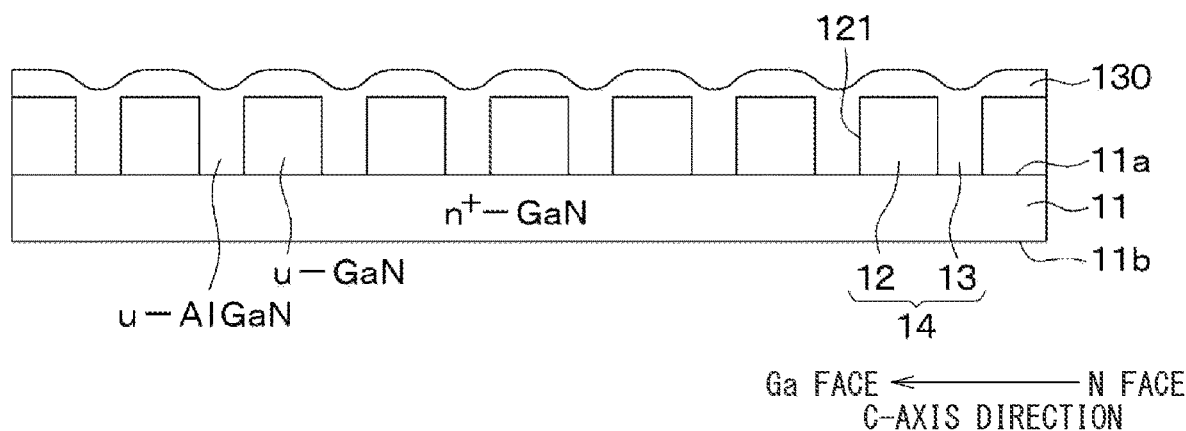
FIG. 6C is a sectional view illustrating the manufacturing process for the semiconductor device, following FIG. 6B.

Subsequently, as shown in FIG. 6C, the second column region forming layer 130 is disposed by epitaxial growth to fill the embedding trenches 121. As a result, the second column regions 13 are formed in the embedding trenches 121 and the PSJ structure 14 including the first column regions 12 and the second column regions 13 is formed.

Figure 6D:
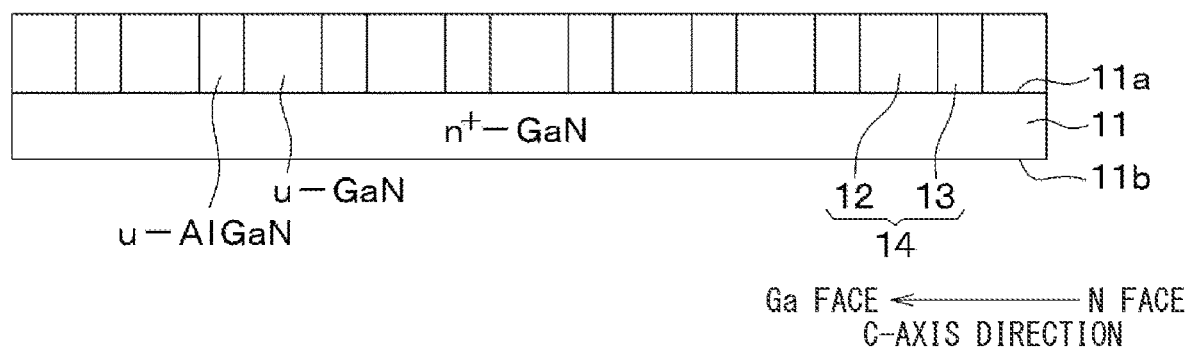
FIG. 6D is a sectional view illustrating the manufacturing process for the semiconductor device, following FIG. 6C.

Thereafter, as shown in FIG. 6D, the second column region forming layer 130 formed over the first column region forming layer 120 is removed. The PSJ structure 14 may be disposed on the GaN substrate 11 as described above.

Second Embodiment

A description will be given to the second embodiment. The present embodiment is obtained by modifying a semiconductor element in the first embodiment. Since the other respects are the same as in the first embodiment, a description thereof is mitted here.

As shown in FIG. 7, a semiconductor device in the present embodiment is configured with a heterojunction bipolar transistor (HBT) formed as a semiconductor element. Specifically, an emitter layer 41 formed of an n-GaN layer rendered n type is disposed on the base layer 15 on the opposite side to the first column regions 12 with the base layer 15 in between. A contact layer 42 formed of an n$^+$-type n$^+$-GaN layer higher in impurity concentration than the emitter layer 41 is disposed on the emitter layer 41. The base layer 15 in the present embodiment is so configured that a dose of Mg as p-type impurity is $1\times10^{20}/cm^2$ and a thickness thereof is equal to or less than 100 nm.

In the present embodiment, the semiconductor substrate 10 has a first surface 10a formed of the contact layer 42 and a second surface 10b of the second principal surface 11b of the GaN substrate 11. Thus, in the semiconductor substrate 10 in the present embodiment, it can also be said that an exposing trench 43 is formed in the first surface 10a of the semiconductor substrate 10 so that the base layer 15 is exposed between the emitter layers 41.

An emitter electrode 51 disposed on the contact layers 42. A base electrode 52 is disposed in a portion of the base layer 15 exposed from the emitter layers 41. A collector electrode 53 is disposed in the second surface 10b of the semiconductor substrate 10. In the present embodiment, the emitter electrodes 51 and the base electrodes 52 correspond to a first surface-side electrode and the collector electrode 53 corresponds to the second surface-side electrode.

A description will be given to an operation and effects of the semiconductor device in the present embodiment with reference to FIG. 8A and FIG. 8B.

Figure 8A:
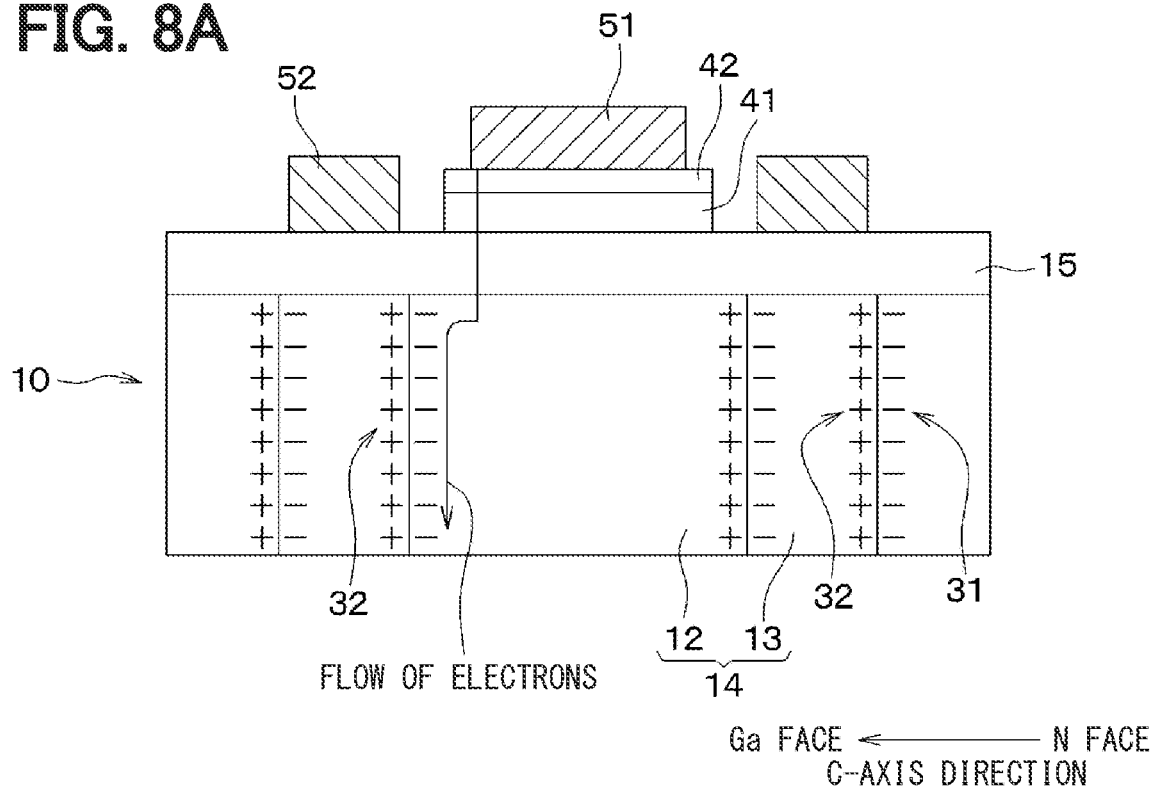
FIG. 8A is a schematic diagram of a semiconductor device in the second embodiment as is brought into an on state.

In the PSJ structure 14, as in the first embodiment and shown in FIG. 8A, 2DEG 31 and 2DHG 32 are produced at the interfaces between the first column regions 12 and the second column regions 13. When a voltage of, for example, 3 to 4 V is applied to the base electrode 52, electrons are supplied from the emitter electrode 51 and a current flows to the collector electrode 53 through the 2DEG 31 formed in the first column regions 12. Since a portion that is prone to be extracted does not exist in the 2DHG 32 at this time, an electron current becomes dominant in the current flowing through the semiconductor device.

Figure 8B:
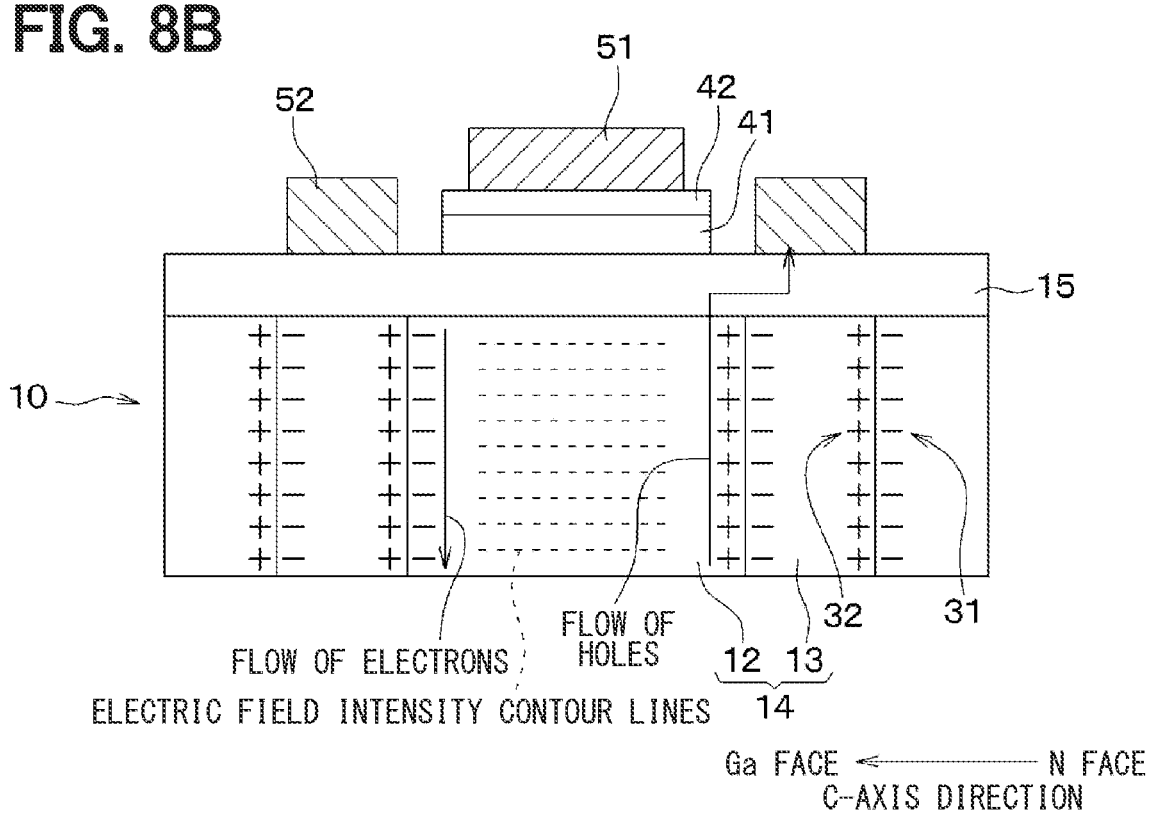
FIG. 8B is a schematic diagram of a semiconductor device in the second embodiment as is brought into an off state.

When a voltage applied to the base electrode 52 becomes equal to, for example, 0V, as shown in FIG. 8B, base potential is increased and electrons are not newly supplied from the emitter electrode 51 anymore. For this reason, even when a positive voltage, for example, 300 V is applied to the collector electrode 53, the semiconductor device is brought into an off state and a current does not flow. At this time, electrons that have been supplied to the first column region 12 are discharged from the collector electrode 53. Holes produced or present in the first column region 12 are discharged from the base electrode 52. As a result, the PSJ structure 14 is depleted and is brought into a charge balance state and balanced at a polarized charge. The dotted lines in FIG. 8B represent a schematic diagram of electric field intensity contour lines.

According to the present embodiment described above, the PSJ structure 14 is arranged along the planar direction of the GaN substrate 11 and a current is let to flow in the thickness direction of the semiconductor substrate 10. Thus, the same effect as in the first embodiment can be obtained.

In the present embodiment, HBT is formed as the semiconductor element and the base layer 15 disposed on the PSJ structure 14 is coupled with the base electrode 52. Therefore, holes that can be present in the first column regions 12 in an off state can be extracted from the base electrode 52 and the PSJ structure 14 can be balanced at a polarized charge.

Third Embodiment

A description will be given to the third embodiment. The present embodiment is obtained by modifying the configurations of the first column regions 12 and the second column regions 13 in the first embodiment. The other respects are the same as in the first embodiment and a description thereof is omitted here.

The basic configuration of a semiconductor device in the present embodiment is the same as in the first embodiment. However, in the present embodiment, as shown in FIG. 9, the first column regions 12 are formed of an n-GaN layer doped with n-type impurity and the second column regions 13 are formed of a p-AlGaN layer doped with p-type impurity. That is, the first column regions 12 and the second column regions 13 are formed of a doped layer.

An example of n-type impurity with which the first column regions 12 are doped is Si (that is, silicon). An example of p-type impurity with which the second column regions 13 are doped is Mg. Impurity concentrations of the first column regions 12 and the second column regions 13 are adjusted according to a width along an arrangement direction (that is, C-axis direction) and an activation ratio of impurity used in doping so that charge balance is maintained. That the first column regions 12 and the second column regions 13 are configured so that charge balance is maintained cited here refers to that the first column regions 12 and the second column regions 13 are configured as described below. That is, the first column regions 12 and the second column regions 13 are configured so that a product of a width of the first column region 12, an n-type impurity concentration, and an activation ratio of n-type impurity and a product of a width of the second column region 13, a p-type impurity concentration, and an activation ratio of p-type impurity are equal to each other.

The first column regions 12 and the second column regions 13 are formed of a doped layer actively doped with impurity and are provided with such impurity concentrations that a fixed charge is $5\times10^{16}/cm^3$ or higher. With respect to the GaN layer, at ambient temperature, an activation ratio of Mg of p-type is approximately 10% at the maximum and an activation ratio of Si of n-type is approximately 100%.

Figure 10:
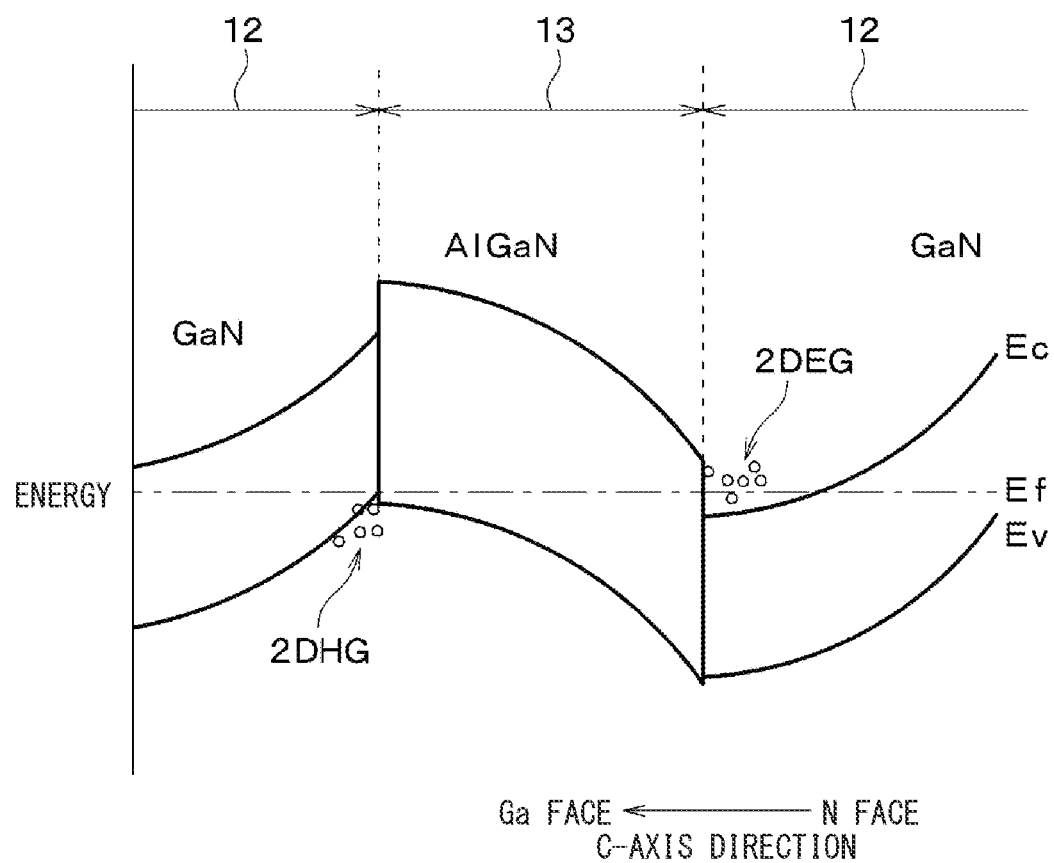
FIG. 10 is an energy band diagram of a PSJ structure in the third embodiment.

In the PSJ structure 14, 2DEG and 2DHG are induced at the AlGaN/GaN interface which is the interface between the first column regions 12 and the second column regions 13 due to a polarization effect and the like. In the case of the present embodiment, the first column regions 12 are formed of an n-GaN layer and the second column regions 13 are formed of a p-AlGaN layer. Thus, as shown in FIG. 10 in comparison with FIG. 3, in the first column regions 12, an energy band varies so as to protrude downward and in the second column regions 13, an energy band varies so as to protrude upward. FIG. 10 is an energy band diagram of a part taken along line X-X of FIG. 9.

Figure 11:
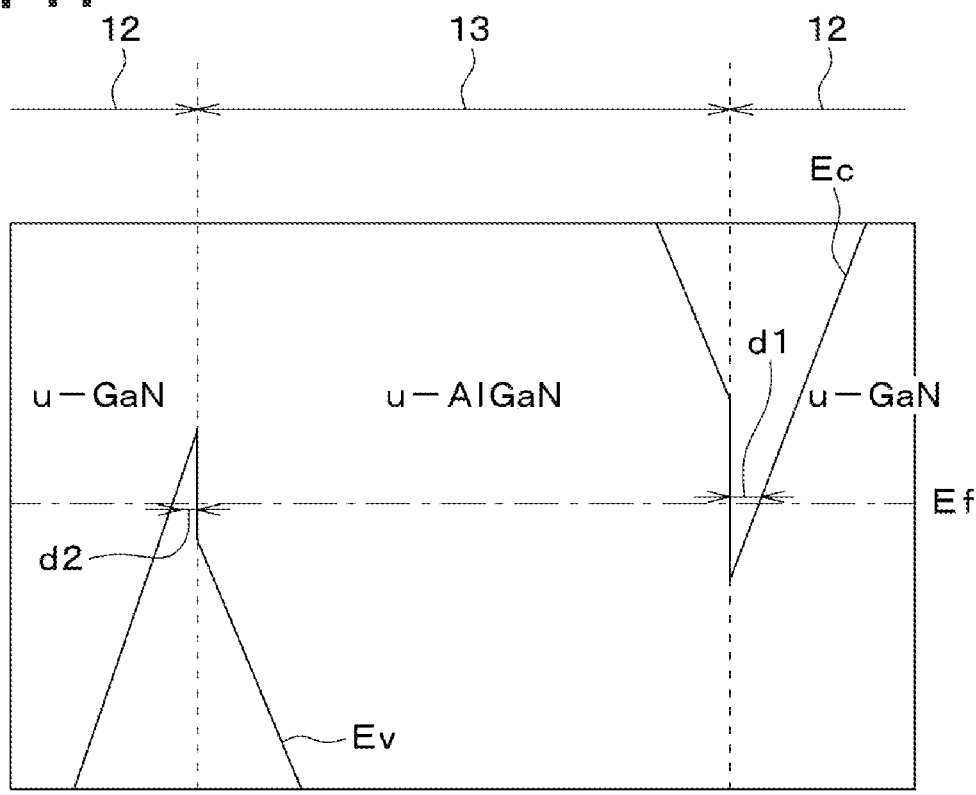
FIG. 11 is an enlarged view of the vicinity of a Fermi level in an energy band diagram in the first embodiment.
Figure 12:
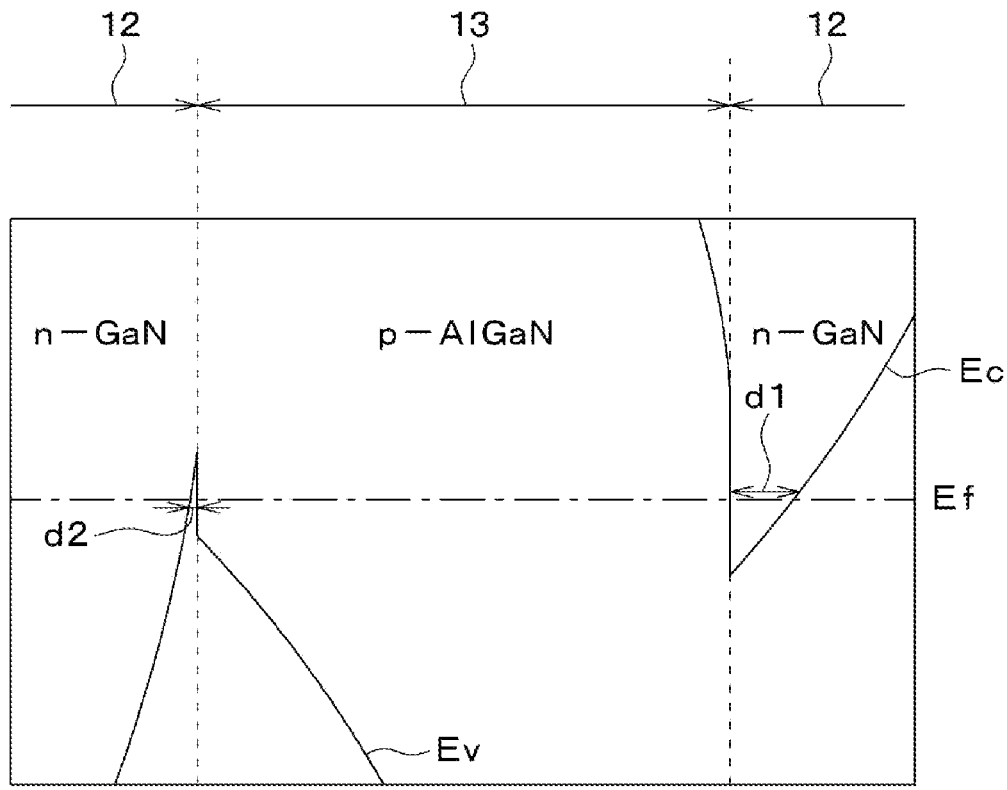
FIG. 12 is an enlarged view of the vicinity of a Fermi level in an energy band diagram in the third embodiment.

Therefore, in the semiconductor device in the present embodiment, as shown in FIG. 11 and FIG. 12, an area (that is, quantum well width d1) where the lower-end energy Ec of a conductor is lower than a Fermi level is widened as compared with a semiconductor device in the first embodiment. As a result, in the first column regions 12, the 2DEG produced on the Ga face side is increased in quantity. In the semiconductor device in the present embodiment, an area (that is, quantum well width d2) where the upper-end energy Ev of a valence band is higher than a Fermi level is reduced as compared with the semiconductor device in the first embodiment. Therefore, in the first column regions 12, the 2DHG produced on the N face side is reduced in quantity.

Figure 13A:
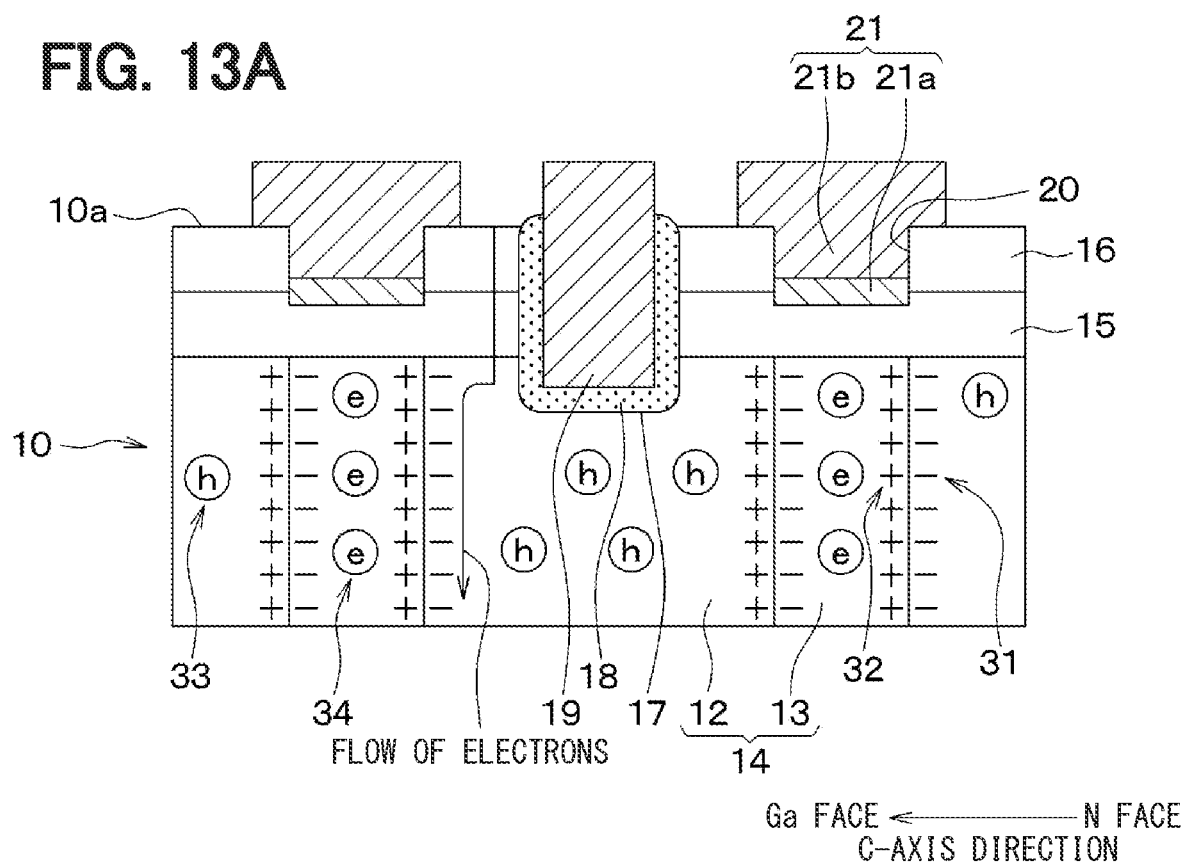
FIG. 13A is a schematic diagram of the semiconductor device in the third embodiment as is brought into an on state.
Figure 13B:
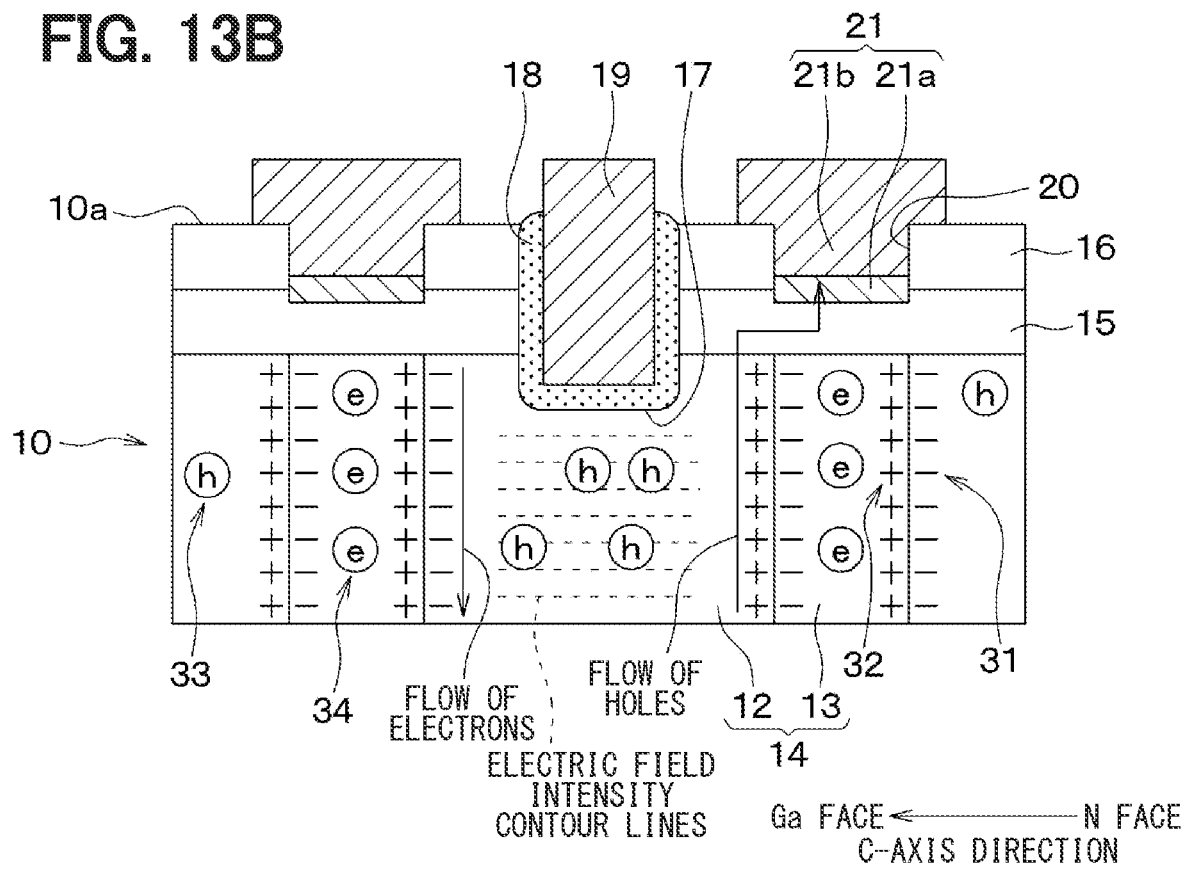
FIG. 13B is a schematic diagram of the semiconductor device in the third embodiment as is brought into an off state.

A description will be given to an operation and effects of the semiconductor device in the present embodiment with reference to FIG. 13A and FIG. 13B. In FIG. 13A and FIG. 13B, the GaN substrate 11 and the drain electrode 22 are omitted.

As shown in FIG. 13A, in the semiconductor device in the present embodiment, as in the first embodiment, 2DEG 31 and 2DHG 32 are produced at the interfaces between the first column regions 12 and the second column regions 13. Since the first column regions 12 are formed of an n-type layer, positive electric charge 33 of fixed charge is produced, and since the second column regions 13 are formed of a p-type layer, negative electric charge 34 of fixed charge is produced. In the first column regions 12, as described above, the 2DEG 31 produced on the Ga face side is increased in quantity. Therefore, an electron current can be increased in quantity when the semiconductor device is on and current capacity can be enhanced.

When a gate voltage applied to the gate electrode 19 becomes less than a threshold voltage, as shown in FIG. 13B, an inversion layer is not formed in the base layer 15 and electrons are not newly supplied from the source electrode 21 anymore. Thereafter, electrons that have been supplied to the first column regions 12 are discharged from the drain electrode 22 and holes produced or present in the first column regions 12 are discharged from the source electrode 21 and an off state is established. Each PSJ structure 14 is depleted and is brought into a charge balance state in which the PSJ structure is balanced at a polarized charge and further balanced at a fixed charge. The dotted lines in FIG. 13B represent a schematic diagram of electric field intensity contour lines.

A description will be given to a manufacturing method of the above-described semiconductor device with reference to FIG. 14A to FIG. 14C.

Figure 14A:
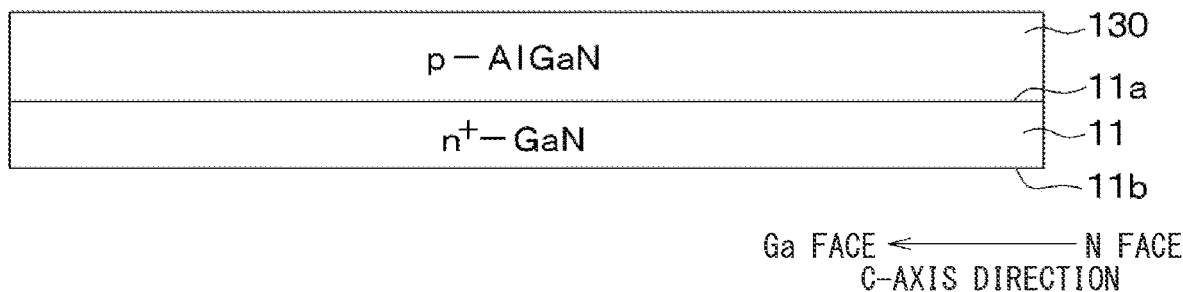
FIG. 14A is a sectional view illustrating a manufacturing process for the semiconductor device in the third embodiment.

First, as shown in FIG. 14A, the GaN substrate 11 in which the first principal surface 11a and the second principal surface 11b are set to the m plane and which is rendered n$^+$ type is prepared. A second column region forming layer 130 forming the second column regions 13 is disposed on the first principal surface 11a of the GaN substrate 11 by epitaxial growth. In the present embodiment, at this time, the second column region forming layer 130 is disposed while doping the layer with p-type impurity such as Mg. That is, the second column region forming layer 130 as a doped layer is disposed.

Figure 14B:
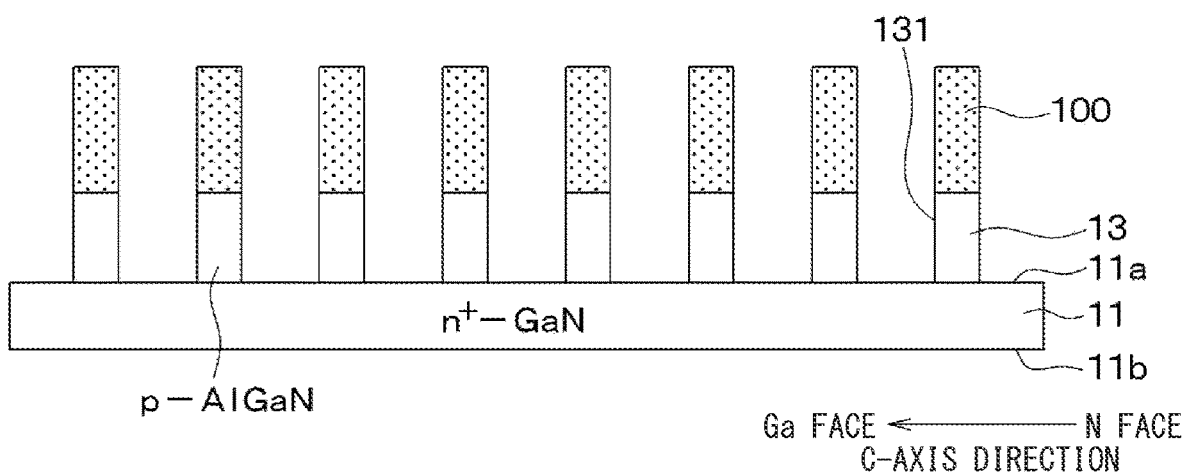
FIG. 14B is a sectional view illustrating the manufacturing process for the semiconductor device, following FIG. 14A.

Subsequently, as shown in FIG. 14B, a resist 100 is disposed on the second column region forming layer 130 and dry etching is performed to form embedding trenches 131 for placing the first column regions 12. As a result, the second column regions 13 formed of a p-AlGaN layer is formed at portions of the second column region forming layer 130 sandwiched between the embedding trenches 131.

Figure 14C:
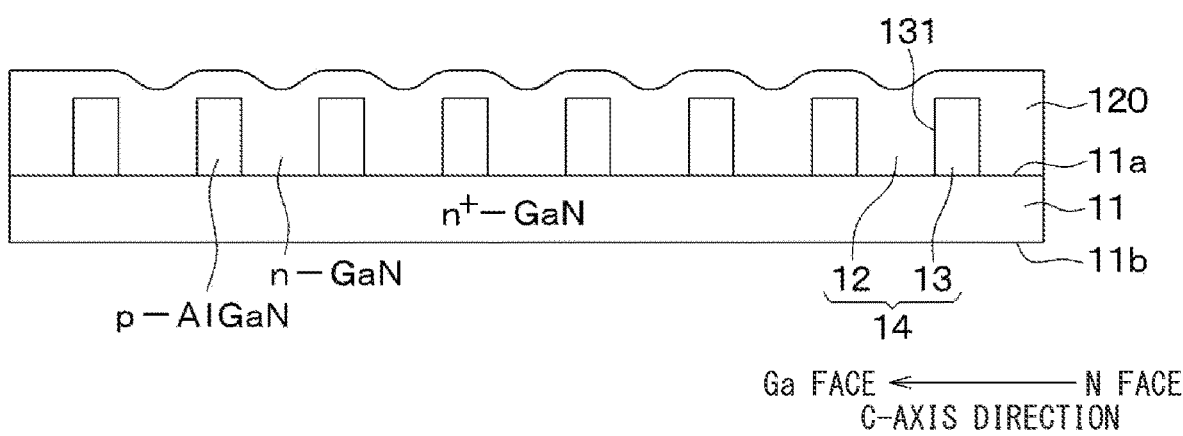
FIG. 14C is a sectional view illustrating the manufacturing process for the semiconductor device, following FIG. 14B.

Subsequently, as shown in FIG. 14C, a first column region forming layer 120 forming the first column regions 12 is disposed by epitaxial growth to fill the embedding trenches 131. In the present embodiment, at this time, the first column region forming layer 120 is disposed while the layer is doped with n-type impurity such as Si. That is, the first column region forming layer 120 as a doped layer is disposed. As a result, the first column regions 12 are formed in the embedding trenches 131 and the PSJ structure 14 including the first column regions 12 and the second column regions 13 is formed. Impurity concentrations of the first column region forming layer 120 and the second column region forming layer 130 are so adjusted that charge balance is maintained when the first column regions 12 and the second column regions 13 are formed.

Though not specially illustrated, the semiconductor device in the present embodiment is manufactured by thereafter performing the process shown in FIG. 5D and the following processes as in the first embodiment.

According to the present embodiment described above, the PSJ structure 14 is arranged along the planar direction of the GaN substrate 11 and a current is let to flow in the thickness direction of the semiconductor substrate 10. Therefore, the same effect as in the first embodiment can be obtained.

In the present embodiment, the first column regions 12 are formed of the n-GaN layer doped with n-type impurity and the second column regions 13 are formed of the p-AlGaN layer doped with p-type impurity. Charge balance is maintained in the first column regions 12 and the second column regions 13. Therefore, the 2DEG can be increased in quantity when the semiconductor device is turned on and current capacity can be enhanced.

(Modification to Third Embodiment)

Figure 15A:
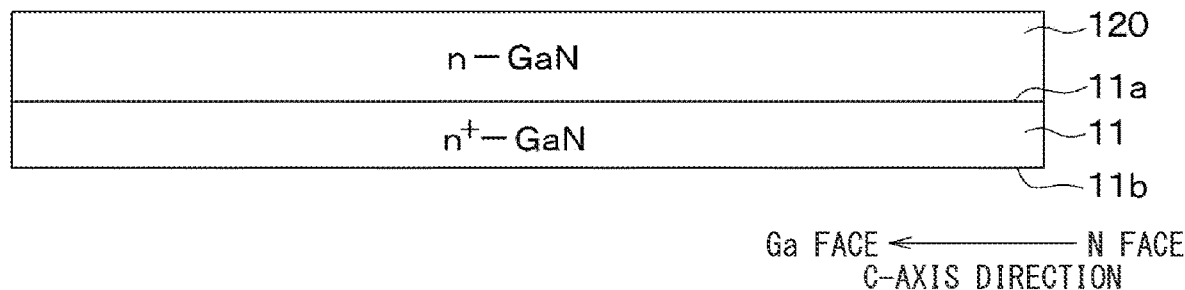
FIG. 15A is a sectional view illustrating a manufacturing process for a semiconductor device in a modification to the third embodiment.
Figure 15B:
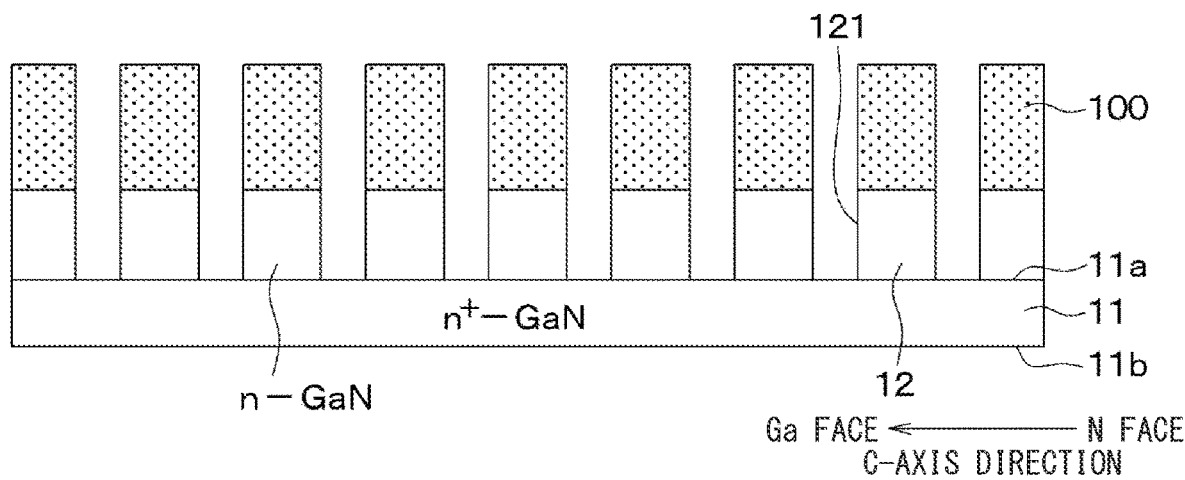
FIG. 15B is a sectional view illustrating the manufacturing process for the semiconductor device, following FIG. 15A.

A description will be given to a modification to the third embodiment. In the third embodiment, the PSJ structure 14 may be formed on the GaN substrate 11 as in the above-described modification to the first embodiment. That is, after the GaN substrate 11 is prepared as shown in FIG. 15A, the first column region forming layer 120 forming the first column regions 12 is disposed on the first principal surface 11a of the GaN substrate 11 by epitaxial growth. At this time, the first column region forming layer 120 is disposed while doping the layer with n-type impurity such as Si. Subsequently, as shown in FIG. 15B, a resist 100 is disposed on the first column region forming layer 120 and dry etching is performed to form the embedding trenches 121 for placing the second column regions 13. As a result, the first column regions 12 are formed at portions of the first column region forming layer 120 sandwiched between embedding trenches 121. Subsequently, as shown in 15C, the second column region forming layer 130 is disposed by epitaxial growth to fill the embedding trenches 121. At this time, the second column region forming layer 130 is disposed while doping the layer with p-type impurity such as Mg. As a result, the second column regions 13 are formed in the embedding trenches 121 and the PSJ structure 14 including the first column regions 12 and the second column regions 13 is formed.

Figure 15C:
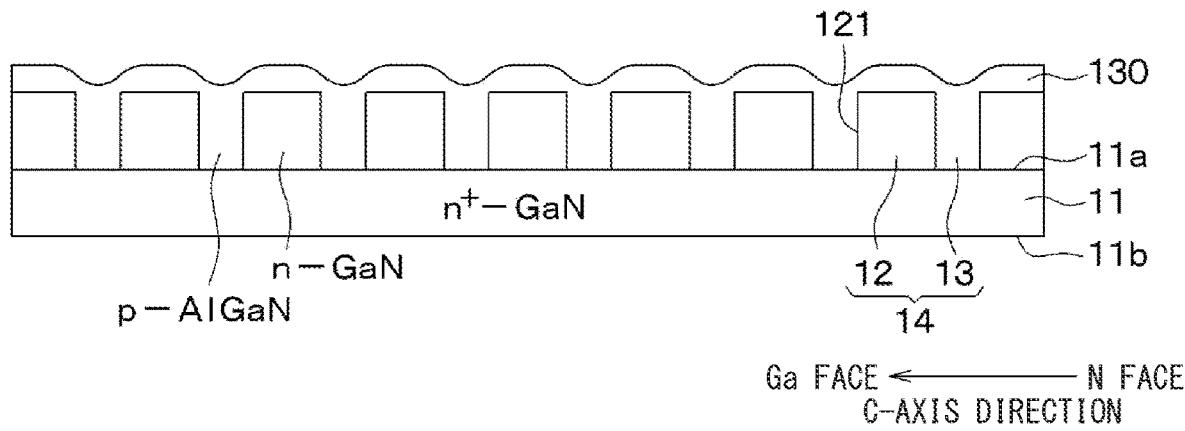
FIG. 15C is a sectional view illustrating the manufacturing process for the semiconductor device, following FIG. 15B.

Though not specially illustrated, the PSJ structure 14 may be disposed on the GaN substrate 11 by thereafter performing the process of FIG. 6D as in the modification to the first embodiment. The base layer 15 formed of a p-GaN layer is disposed on the PSJ structure 14. Therefore, when the semiconductor device is manufactured, after the process of FIG. 15C is performed, a p-GaN layer may be formed to from the base layer 15 without removing the second column region forming layer 130 formed over the first column region forming layer 120. That is, the PSJ structure 14 and the base layer 15 may be continuously formed by setting 1 for x of the $Al_{1-x}Ga_xN$ layer forming the second column regions 13.

Fourth Embodiment

A description will be given to the fourth embodiment. The present embodiment is obtained by modifying the configurations of the first column regions 12 and the second column regions 13 in the second embodiment. The other respects are the same as in the second embodiment and a description thereof is omitted here.

As shown in FIG. 16, a semiconductor device in the present embodiment is configured with the same HBT as in the second embodiment formed. In the semiconductor device in the present embodiment, however, as in the third embodiment, the first column regions 12 are formed of an n-GaN layer doped with n-type impurity and the second column regions 13 are formed of a p-AlGaN layer doped with p-type impurity. That is, the first column regions 12 and the second column regions 13 are formed of a doped layer. As in the third embodiment, widths and impurity concentrations of the first column regions 12 and the second column regions 13 are adjusted so that charge balance is maintained.

A description will be given to an operation and effects of a semiconductor device in the present embodiment with reference to FIG. 17A and FIG. 17B.

As in the second embodiment and shown in FIG. 17A, in the PSJ structure 14, 2DEG 31 and 2DHG 32 are produced at the interfaces between the first column regions 12 and the second column regions 13. As in the third embodiment, in the first column regions 12, positive electric charge 33 of fixed charge is produced and in the second column regions 13, negative electric charge 34 of fixed charge is produced. In the first column regions 12, the 2DEG 31 (that is, negative electric charge of polarized charge) produced on the Ga face side is increased in quantity. Therefore, an electron current can be increased when the semiconductor device is on and current capacity can be enhanced.

When a voltage applied to the base electrode 52 becomes, for example, 0 V as shown in FIG. 17B, base potential is increased and new electrons are not supplied from the emitter electrode 51 anymore. Thus, even when a positive voltage, for example, 300V is applied to the collector electrode 53, the semiconductor device is brought into an off state and a current does not flow. At this time, electrons that have been supplied to the first column regions 12 are discharged from the collector electrode 53. Holes produced or present in the first column regions 12 are discharged from the base electrode 52. As a result, the PSJ structure 14 is depleted and is brought into a charge balance state in which the PSJ structure is balanced at a polarized charge and further balanced at a fixed charge. The dotted lines in FIG. 17B show a schematic diagram of electric field intensity contour lines.

According to the present embodiment described above, the PSJ structure 14 is arranged along the planar direction of the GaN substrate 11 and a current is let to flow in the thickness direction of the semiconductor substrate 10. Therefore, the same effect as in the first embodiment can be obtained.

In the present embodiment, the first column regions 12 are formed of an n-GaN layer doped with n-type impurity and the second column regions 13 are formed of a p-AlGaN layer doped with p-type impurity. Widths and impurity concentrations of the first column regions 12 and the second column regions 13 are adjusted so that charge balance is maintained. Therefore, the 2DEG 31 can be increased in quantity when the semiconductor device is turned on and current capacity can be enhanced.

Other Embodiments

The present disclosure has been described based on embodiments but it is understood that the present disclosure is not limited to these embodiments or structures thereof. The present disclosure also includes various modifications and modifications within an equivalent range. In addition, various combinations and modes and other combinations and modes including only, more, or less than one element are also included in the category or scope of philosophy of the present disclosure.

Figure 18:
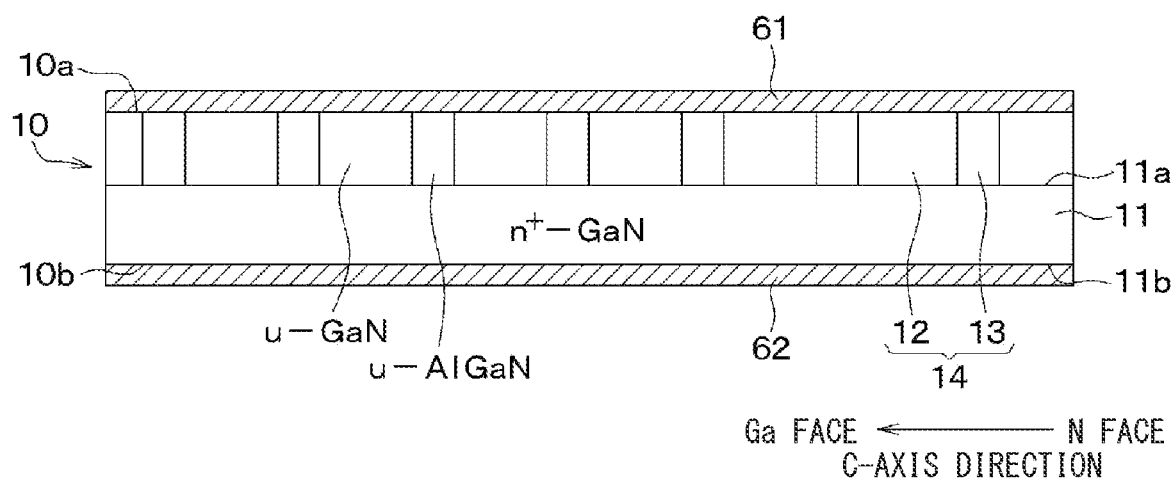
FIG. 18 is a sectional view of a semiconductor device in another embodiment.

Some examples will be taken. In the above descriptions of the first and third embodiments, the semiconductor device with MOSFET formed as the semiconductor element has been taken as an example, and in the above descriptions of the second and fourth embodiments, the semiconductor device with HBT formed as the semiconductor element has been taken as an example. However, the semiconductor element may be any other semiconductor element and may be a diode as shown in FIG. 18. Specifically, in this semiconductor device, the PSJ structure 14 is disposed on the GaN substrate 11 to form the semiconductor substrate 10. In the present embodiment, the semiconductor substrate 10 has a first surface 10a formed of the PSJ structure 14 and a second surface 10b formed of the second principal surface 11b of the GaN substrate 11. In the semiconductor substrate 10, an anode electrode 61 as a first surface-side electrode is disposed on the first surface 10a and a cathode electrode 62 as a second surface-side electrode is disposed on the second surface 10b. In this case, as in the third and fourth embodiments, the first column regions 12 and the second column regions 13 may be formed of a doped layer.

In the above descriptions of the first and third embodiments, the n channel-type MOSFET of the trench gate structure in which n-type is taken as a first conductivity type and p-type is taken as a second conductivity type has been taken as an example. In the semiconductor device, instead, a p channel-type, rather than n channel-type, MOSFET of a trench gate structure may be formed. Further, the semiconductor device may be configured with, aside from MOSFET, IGBT of a similar structure formed. In case of IGBT, the IGBT is the same as the vertical MOSFET described in relation to the first embodiment except that the n$^+$-type GaN substrate 11 in the first and third embodiments is replaced with a p$^+$-type GaN substrate 11.

In the above descriptions of the second and fourth embodiments, the npn-type HBT in which n type is taken as a first conductivity type and p type is taken as a second conductivity type has been taken as an example of a semiconductor element. Instead, the semiconductor device may be configured with a pnp-type HBT formed as a semiconductor element.

In the above descriptions of the third and fourth embodiments, the semiconductor device with the first column regions 12 doped with n-type impurity and the second column regions 13 doped with p-type impurity has been taken as an example. Instead, the first column regions 12 may be formed of a doped layer doped with p-type impurity and the second column regions 13 may be formed of a doped layer doped with n-type impurity. In this case, an area (that is, quantum well width d2) where the upper-end energy Ev of a valence band is higher than a Fermi level is increased as compared with cases where the first column regions 12 and the second column regions 13 are formed of an updoped layer and thus hole concentration is increased. Therefore, such a semiconductor device is preferably applicable to a configuration in which a hole current is dominant in an on state.

In the above descriptions of the third and fourth embodiments, a case where the first column regions 12 and the second column regions 13 are formed of doped layers by performing epitaxial growth while impurity doping is performed has been taken as an example. Instead, the first column regions 12 and the second column regions 13 as a doped layer may be formed as described below. For example, by performing impurity ion implantation after performing the step of FIG. 5D in the first embodiment, the first column regions 12 formed of an n-GaN layer may be configured and the second column regions 13 formed of a p-AlGaN layer may be configured.

A description will be given to various aspects of the present disclosure. According to a first aspect of the present disclosure, a semiconductor includes a semiconductor substrate, a first surface-side electrode, and a second surface-side electrode. The semiconductor substrate has a first surface and a second surface opposite to each other, and includes a semiconductor element. The first surface-side electrode is disposed on the first surface of the semiconductor substrate and is electrically coupled with the semiconductor element. The second surface-side electrode is disposed on the second surface of the semiconductor substrate and is electrically coupled with the semiconductor element. The semiconductor substrate includes a gallium nitride substrate and a plurality of first column regions and a plurality of second column regions. The gallium nitride substrate has a hexagonal structure, and has a first principal surface and a second principal surface opposite to each other. The first principal surface is set to an m plane. One direction in a planar direction of the first principal surface is a direction along a c-axis direction, and the second principal surface forms the second surface of the semiconductor substrate. The first column regions and the second column regions are disposed on the first principal surface of the gallium nitride substrate. The first column regions are formed of a first nitride semiconductor layer and extend along a direction in the planar direction of the gallium nitride substrate. The second column regions are formed of a second nitride semiconductor layer that is higher in band gap than the first nitride semiconductor layer. Each of the second column regions is disposed between adjacent two of the first column regions. The first column regions and the second column regions form a polarization super junction structure. The first column regions and the second column regions are alternately arranged along the c-axis direction in the first principal surface. The semiconductor element is configured to enable a current to flow between the first surface and the second surface of the semiconductor substrate.

According to a second aspect of the present disclosure, the semiconductor device according to the first aspect may further include a base layer disposed on the polarization super junction structure and having a first conductivity type or a second conductivity type, and the first surface-side electrode may include a base layer electrode coupled with the base layer.

According to a third aspect of the preset disclosure, the semiconductor device according to the second aspect may further include an impurity region disposed on the base layer and coupled with the base layer electrode and a trench gate structure. The trench gate structure may include a trench penetrating the base layer and reaching the polarization super junction structure, a gate insulating film disposed on a wall surface of the trench, and a gate electrode disposed on the gate insulating film and included in the first surface-side electrode.

According to a fourth aspect of the present disclosure, the semiconductor device according to the second aspect may further include an emitter layer disposed on the base layer and having an opening through which a part of the base layer is exposed, and an emitter electrode coupled with the emitter layer and included in the first surface-side electrode.

According to a fifth aspect of the present disclosure, in the semiconductor device according to the first aspect, the first surface-side electrode may be disposed on the polarization super junction structure and may be coupled directly with the polarization super junction structure.

According to a sixth aspect of the present disclosure, in the semiconductor device according to any one of the first to fifth aspects, the first column regions and the second column regions may be formed of an updoped layer.

According to a seventh aspect of the present disclosure, in the semiconductor device according to any one of the first to fifth aspects, the first column regions and the second column regions may be formed of a doped layer and a charge balance is maintained.

According to an eighth aspect of the present disclosure, a manufacturing method of the semiconductor device according to the first aspect includes: preparing the gallium nitride substrate; epitaxially growing a second column region forming layer that forms the plurality of second column regions on the first principal surface of the gallium nitride substrate; forming a plurality of embedding trenches at a plurality of portions in the second column region forming layer where the plurality of first column regions is to be formed, and taking a plurality of portions in the second column region forming layer different from the plurality of portions where the plurality of embedding trenches is formed as the plurality of second column regions; and epitaxially growing a first column region forming layer that forms the plurality of first column regions to fill the plurality of embedding trenches, taking the first column region forming layer disposed in the plurality of embedding trenches as the plurality of first column regions, and forming the polarization super junction structure having the plurality of first column regions and the plurality of second column regions.

According to a ninth aspect of the present disclosure, a manufacturing method of the semiconductor device according to the first aspect includes: preparing the gallium nitride substrate; epitaxially growing a first column region forming layer that forms the plurality of first column regions on the first principal surface of the gallium nitride substrate; forming a plurality of embedding trenches at a plurality of portions in the first column region forming layer where the plurality of second column regions is to be formed, and taking a plurality of portions in the first column region forming layer different from the plurality of portions where the plurality of embedding trenches is formed as the plurality of first column regions; and epitaxially growing a second column region forming layer that forms the plurality of second column regions to fill the plurality of embedding trenches, taking the second column region forming layer disposed in the plurality of embedding trenches as the plurality of second column regions, and forming the polarization super junction structure having the plurality of first column regions and the plurality of second column regions.

According to a tenth aspect of the present disclosure, in the manufacturing method according to the eighth or ninth aspect, the forming the polarization super junction structure may include forming each of the plurality of first column regions and each of the plurality of second column regions from an updoped layer.

According to an eleventh aspect of the present disclosure, in the manufacturing method according to the eighth or ninth aspect, the forming the polarization super junction structure may include forming each of the plurality of first column regions and each of the plurality of second column regions from a doped layer.

What is claimed is:
1. A semiconductor device comprising:
a semiconductor substrate having a first surface and a second surface opposite to each other, and including a semiconductor element;
a first surface-side electrode disposed on the first surface of the semiconductor substrate and electrically coupled with the semiconductor element; and
a second surface-side electrode disposed on the second surface of the semiconductor substrate and electrically coupled with the semiconductor element, wherein
the semiconductor substrate includes:
a gallium nitride substrate having a hexagonal structure, and having a first principal surface and a second principal surface opposite to each other, the first principal surface being set to an m plane, one direction in a planar direction of the first principal surface being a direction along a c-axis direction, and the second principal surface forming the second surface of the semiconductor substrate; and
a plurality of first column regions and a plurality of second column regions disposed on the first principal surface of the gallium nitride substrate, the plurality of first column regions formed of a first nitride semiconductor layer and extending along a direction in the planar direction of the gallium nitride substrate, the plurality of second column regions formed of a second nitride semiconductor layer that is higher in band gap than the first nitride semiconductor layer, each of the plurality of second column regions disposed between adjacent two of the plurality of first column regions, the plurality of first column regions and the plurality of second column regions forming a polarization super junction structure,
the plurality of first column regions and the plurality of second column regions are alternately arranged along the c-axis direction in the first principal surface, and
the semiconductor element is configured to enable a current to flow between the first surface and the second surface of the semiconductor substrate.

2. The semiconductor device according to claim 1, further comprising
a base layer disposed on the polarization super junction structure and having a first conductivity type or a second conductivity type, wherein
the first surface-side electrode includes a base layer electrode coupled with the base layer.

3. The semiconductor device according to claim 2, further comprising:
an impurity region disposed on the base layer and coupled with the base layer electrode; and
a trench gate structure including a trench penetrating the base layer and reaching the polarization super junction structure, a gate insulating film disposed on a wall surface of the trench, and a gate electrode disposed on the gate insulating film and included in the first surface-side electrode.

4. The semiconductor device according to claim 2, further comprising:
   an emitter layer disposed on the base layer and having an opening through which a part of the base layer is exposed; and
   an emitter electrode coupled with the emitter layer and included in the first surface-side electrode.

5. The semiconductor device according to claim 1, wherein
   the first surface-side electrode is disposed on the polarization super junction structure and is coupled directly with the polarization super junction structure.

6. The semiconductor device according to claim 1, wherein
   the plurality of first column regions and the plurality of second column regions are formed of an updoped layer.

7. The semiconductor device according to claim 1, wherein
   the plurality of first column regions and the plurality of second column regions are formed of a doped layer and a charge balance is maintained.

\* \* \* \* \*